US010998908B2

(12) United States Patent
Lin

(10) Patent No.: US 10,998,908 B2
(45) Date of Patent: May 4, 2021

(54) PHASE LOCKED LOOP

(71) Applicant: SONY SEMICONDUCTOR SOLUTIONS CORPORATION, Kanagawa (JP)

(72) Inventor: Yinta Lin, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/753,605

(22) PCT Filed: Oct. 1, 2018

(86) PCT No.: PCT/JP2018/036704
§ 371 (c)(1),
(2) Date: Apr. 3, 2020

(87) PCT Pub. No.: WO2019/073841
PCT Pub. Date: Apr. 18, 2019

(65) Prior Publication Data
US 2020/0336149 A1 Oct. 22, 2020

(30) Foreign Application Priority Data
Oct. 12, 2017 (JP) .............................. JP2017-198347

(51) Int. Cl.
*H03L 7/00* (2006.01)
*H03L 7/093* (2006.01)
(Continued)

(52) U.S. Cl.
CPC ............ *H03L 7/093* (2013.01); *H03L 7/0893* (2013.01); *H03L 7/099* (2013.01)

(58) Field of Classification Search
CPC ....... H03L 7/093; H03L 7/0893; H03L 7/099; H03L 7/095; H03L 7/0891
See application file for complete search history.

(56) References Cited

U.S. PATENT DOCUMENTS

| 9,356,609 B1 | 5/2016 | Ek et al. |
| 2013/0316661 A1 | 11/2013 | Lee et al. |

(Continued)

FOREIGN PATENT DOCUMENTS

| CN | 104428996 A | 3/2015 |
| CN | 107112984 A | 8/2017 |

(Continued)

OTHER PUBLICATIONS

Chuang, et al., "A 1V Phase Locked Loop with Leakage Compensation in 0.13 μm CMOS Technology", The Institute of Electronics, Information and Communication Engineers, IEICE Transactions on Electronics, vol. E89-C, No. 3, Mar. 2006, pp. 295-297.

(Continued)

*Primary Examiner* — Kabir A Timory
(74) *Attorney, Agent, or Firm* — Chip Law Group

(57) ABSTRACT

A phase locked loop of the present disclosure includes a phase comparator circuit, a loop filter, an oscillator circuit, an AD converter circuit, and a current generator circuit. The phase comparator circuit compares a phase of a first signal and a phase of a second signal based on a clock signal. The loop filter includes a resistor element and a capacitor element, and generates a control voltage on the basis of a phase comparison result of the phase comparator circuit. The resistor element has one end coupled to a first node and another end coupled to a second node. The capacitor element has one end coupled to the second node. The oscillator circuit generates the clock signal on the basis of the control voltage. The AD converter circuit converts a voltage difference between the two ends of the resistor element into a digital code. The current generator circuit generates a first current on the basis of the digital code and supplies the first current to the second node.

12 Claims, 17 Drawing Sheets

(51) Int. Cl.
    *H03L 7/089*         (2006.01)
    *H03L 7/099*         (2006.01)

(56)            References Cited

U.S. PATENT DOCUMENTS

| | | | |
|---|---|---|---|
| 2015/0145569 A1* | 5/2015 | Perrott | H03M 3/368 |
| | | | 327/157 |
| 2016/0182059 A1 | 6/2016 | Ek et al. | |
| 2016/0240921 A1 | 8/2016 | Ek et al. | |
| 2017/0207807 A1 | 7/2017 | Lee et al. | |
| 2018/0183566 A1* | 6/2018 | Tajalli | H03L 7/095 |

FOREIGN PATENT DOCUMENTS

| | | |
|---|---|---|
| EP | 2847865 A1 | 3/2015 |
| EP | 3235134 A1 | 10/2017 |
| JP | 2007-184778 A | 7/2007 |
| JP | 2015-516133 A | 6/2015 |
| JP | 2018-110421 A | 7/2018 |
| KR | 10-2013-0126431 A | 11/2013 |
| KR | 10-2018-0039603 A | 4/2018 |
| WO | 2013/169071 A1 | 11/2013 |
| WO | 2016/096853 A1 | 6/2016 |

OTHER PUBLICATIONS

Chang, et al., "A Phase-Locked Loop With Background Leakage Current Compensation", IEEE, Transactions on Circuits and Systems II: Express Briefs, vol. 57, No. 9, Sep. 2010, pp. 666-670.
International Search Report and Written Opinion of PCT Application No. PCT/JP2018/036704, dated Dec. 11, 2018, 8 pages of ISRWO.

\* cited by examiner

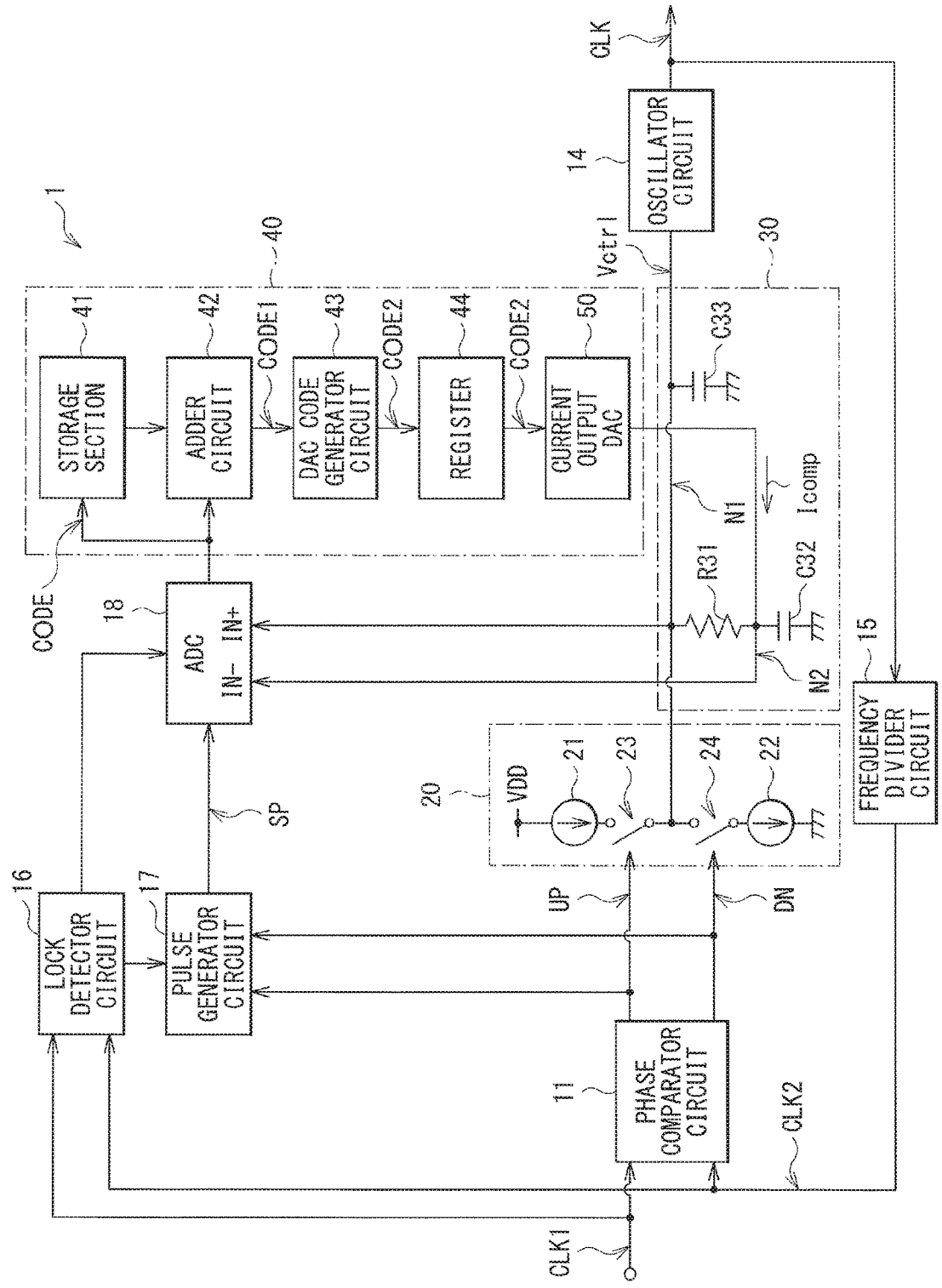

[FIG. 2A]
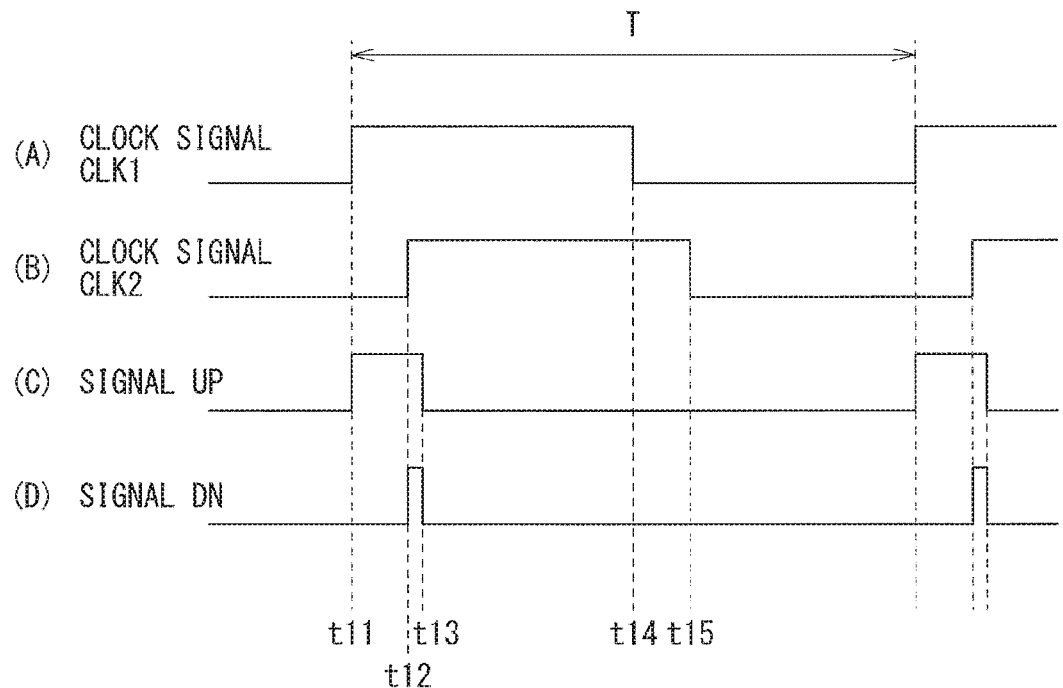
[FIG. 2B]
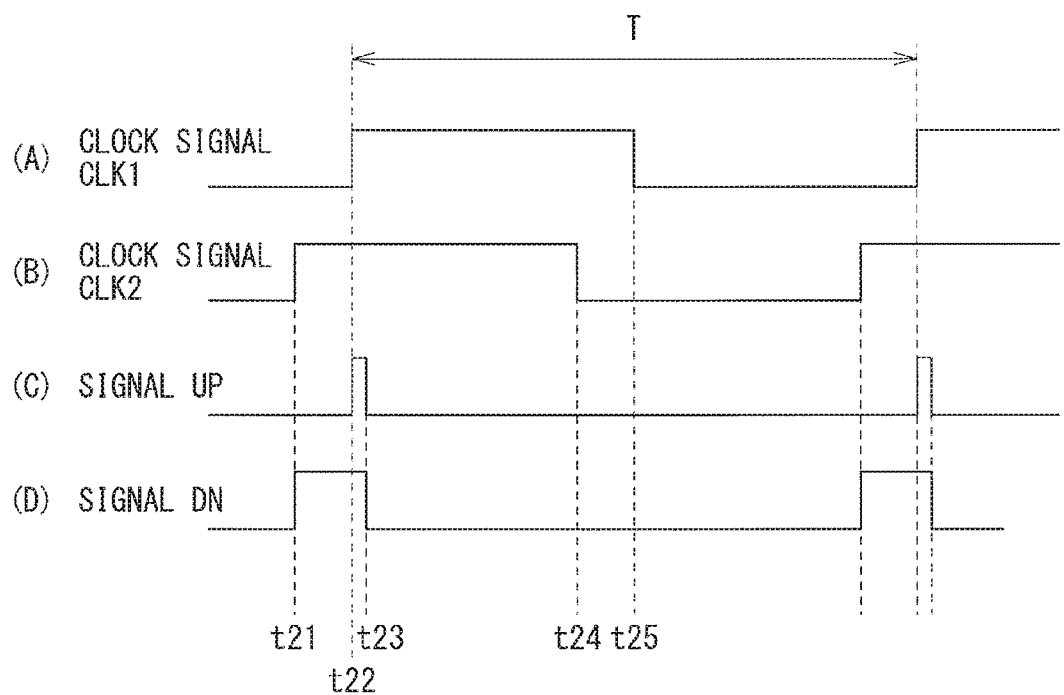

[FIG. 2C]
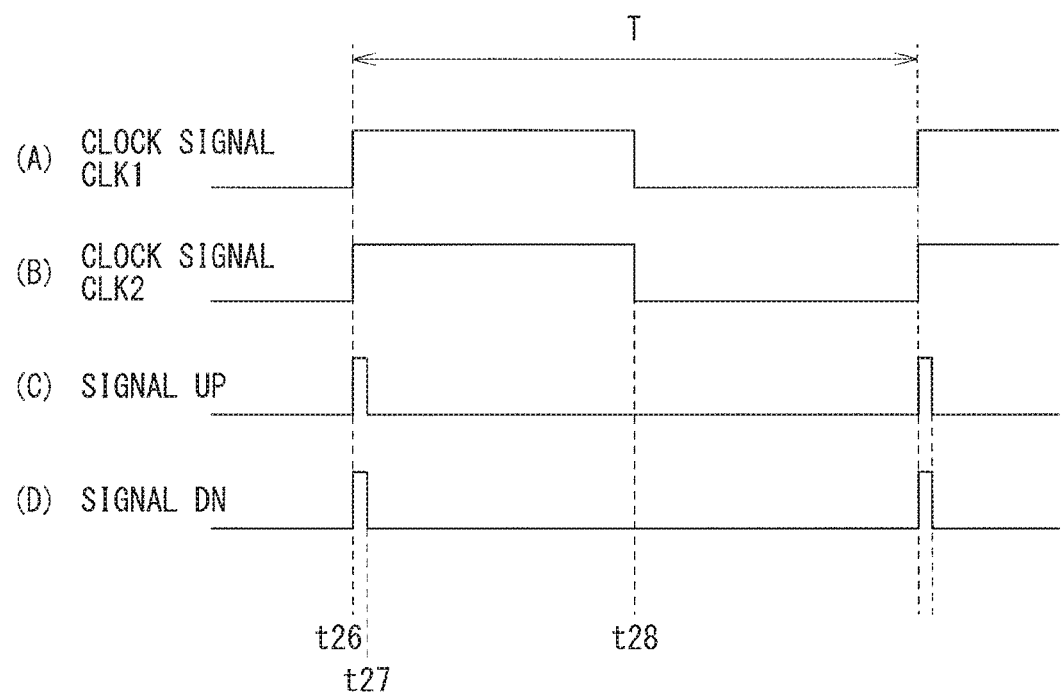

[FIG. 3A]
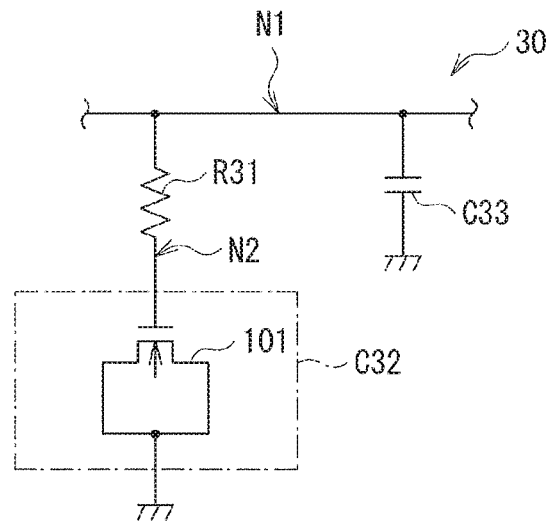
[FIG. 3B]
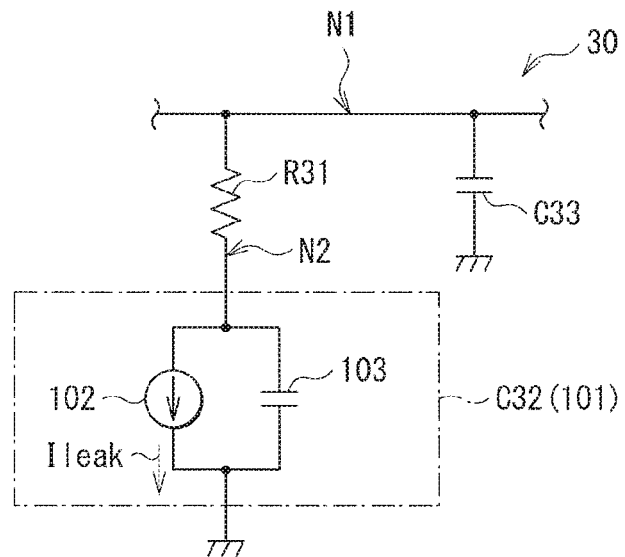

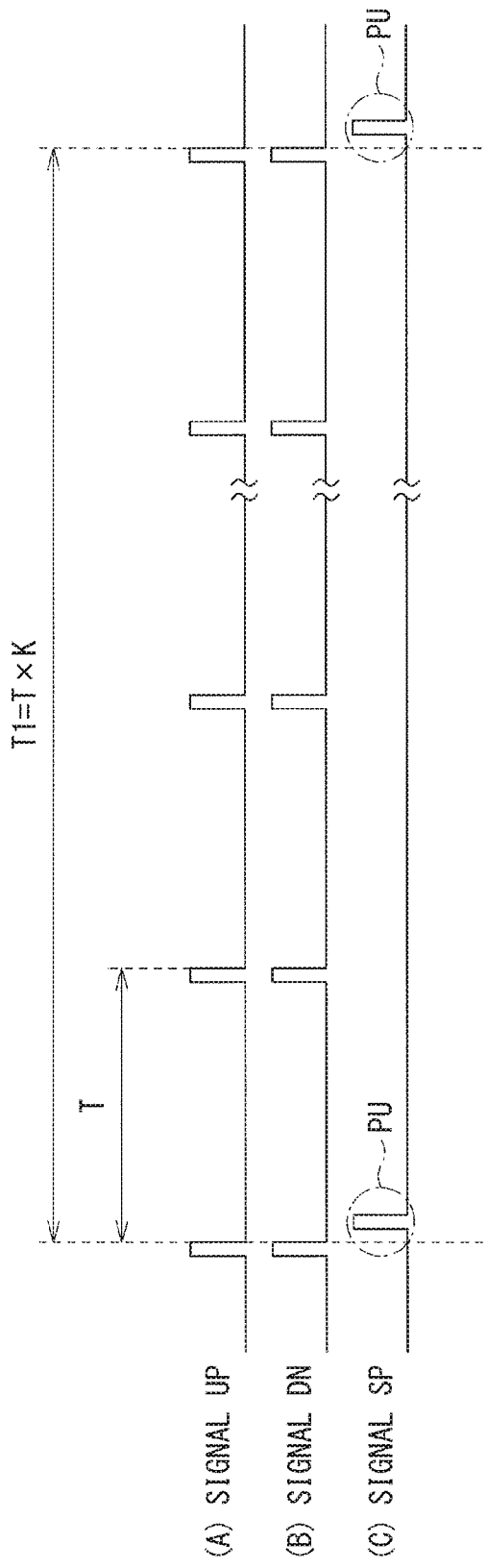

[FIG. 5]
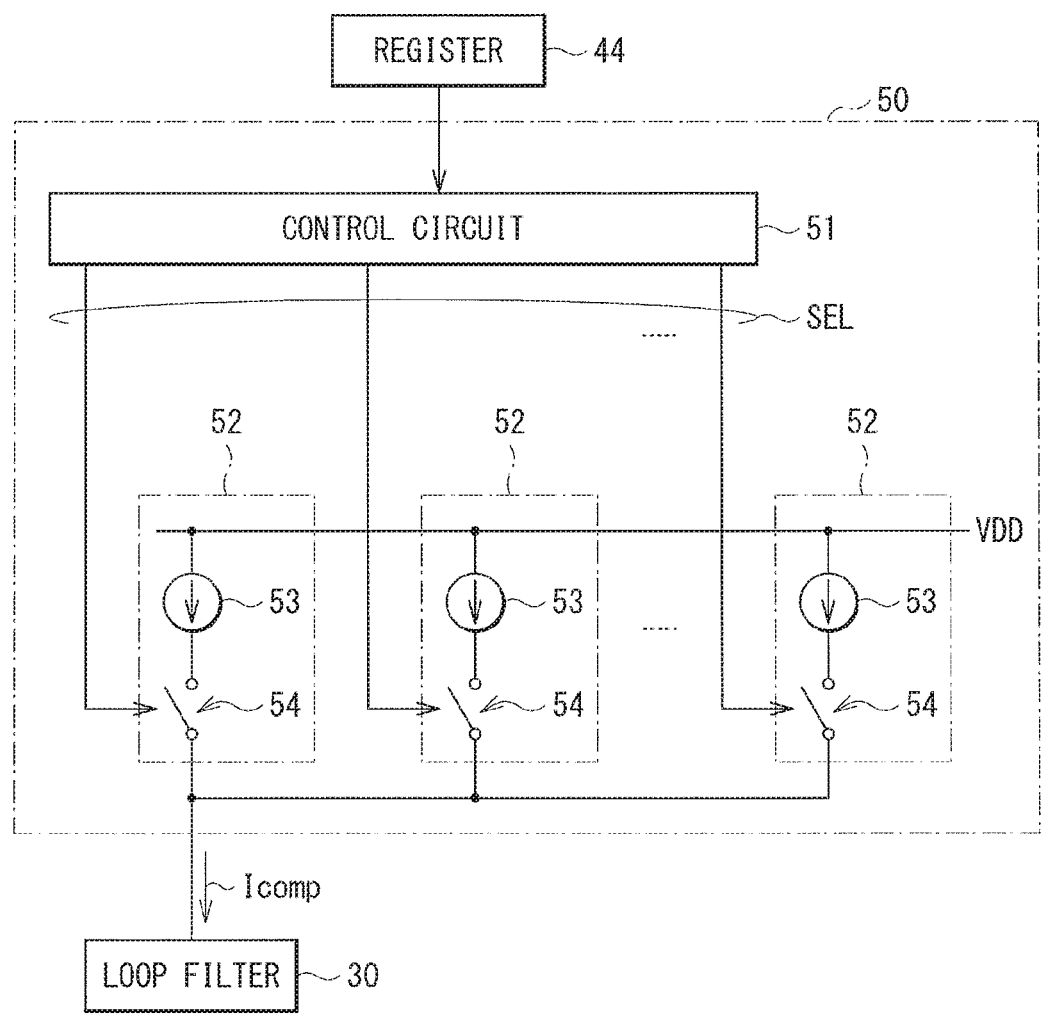

[FIG. 6]
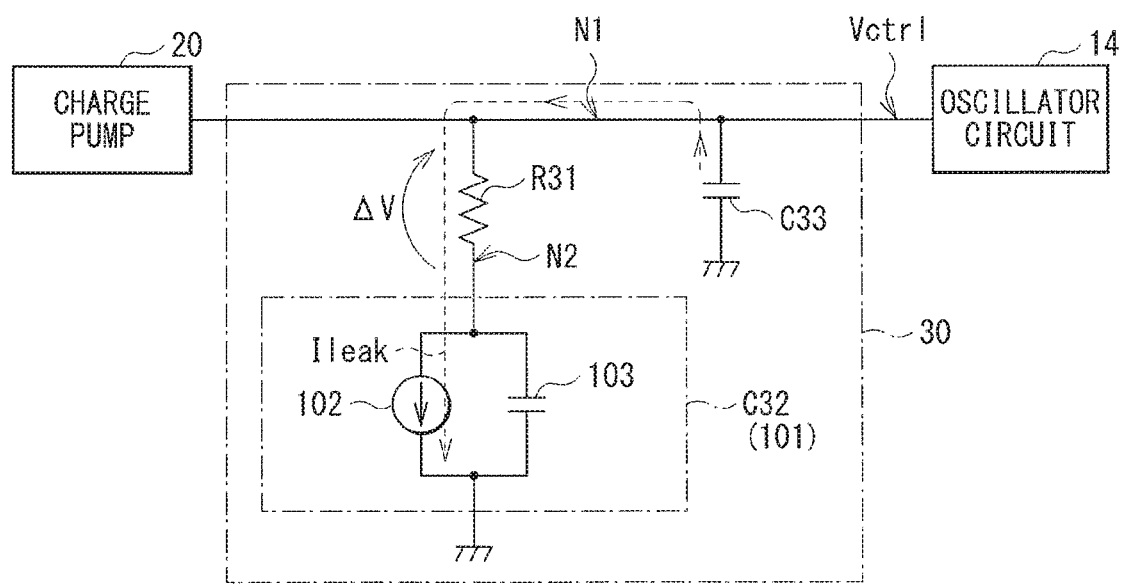

[FIG. 7A]
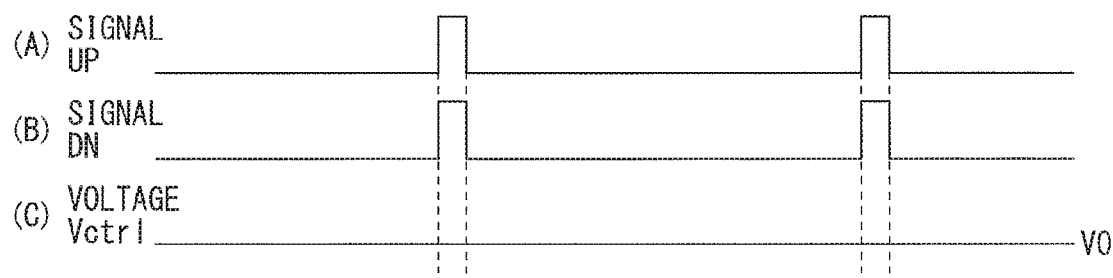
[FIG. 7B]
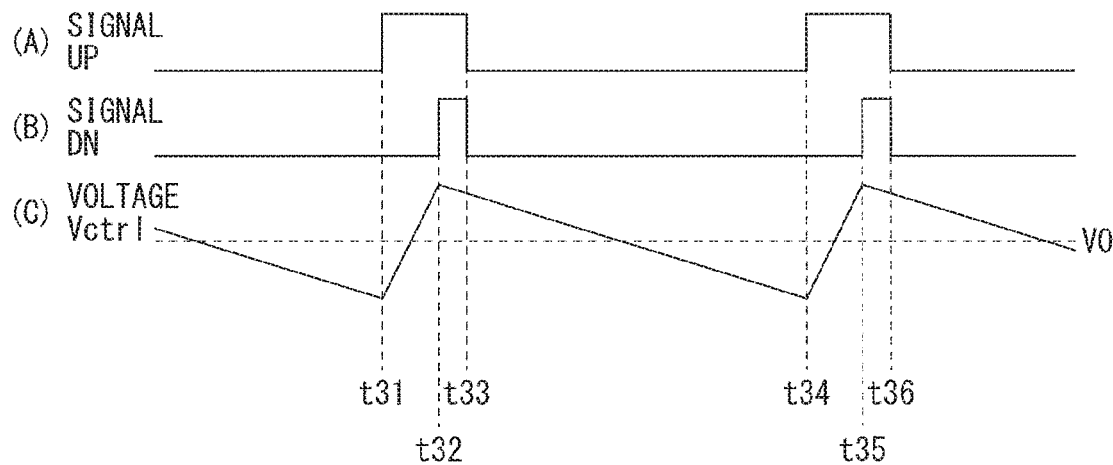

[FIG. 8]
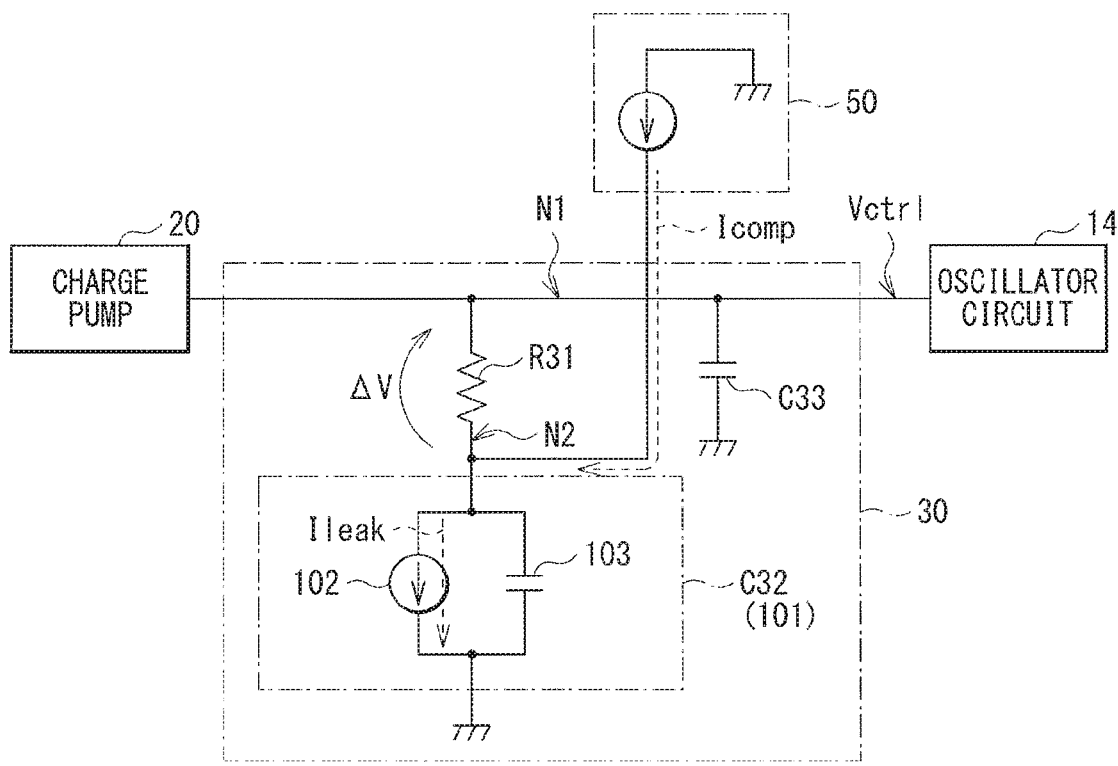
[FIG. 9]
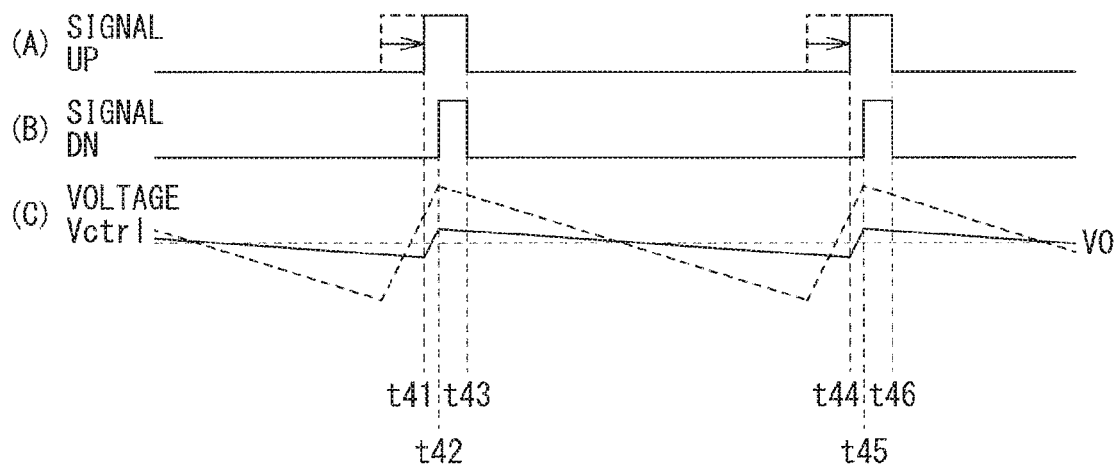

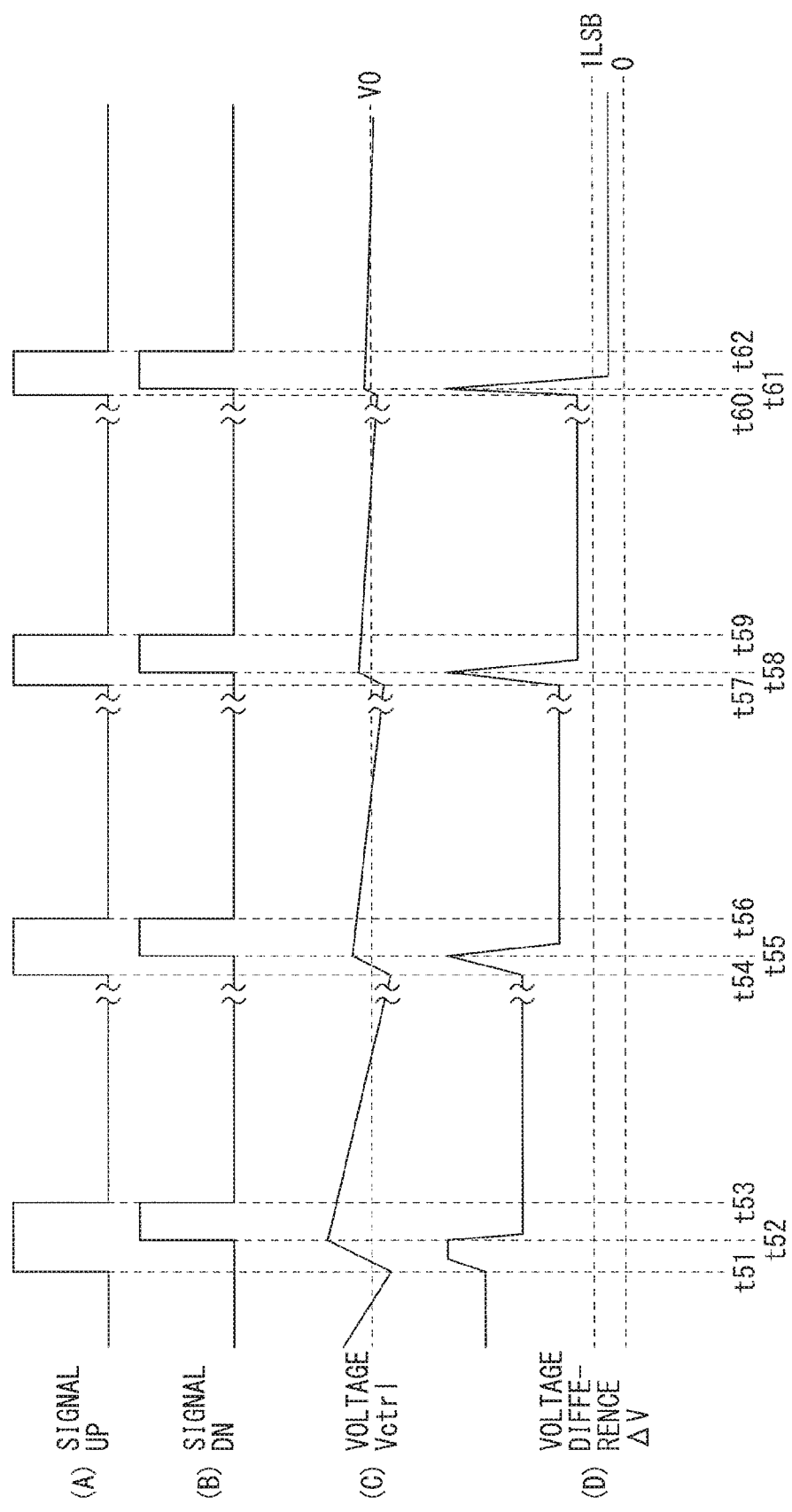

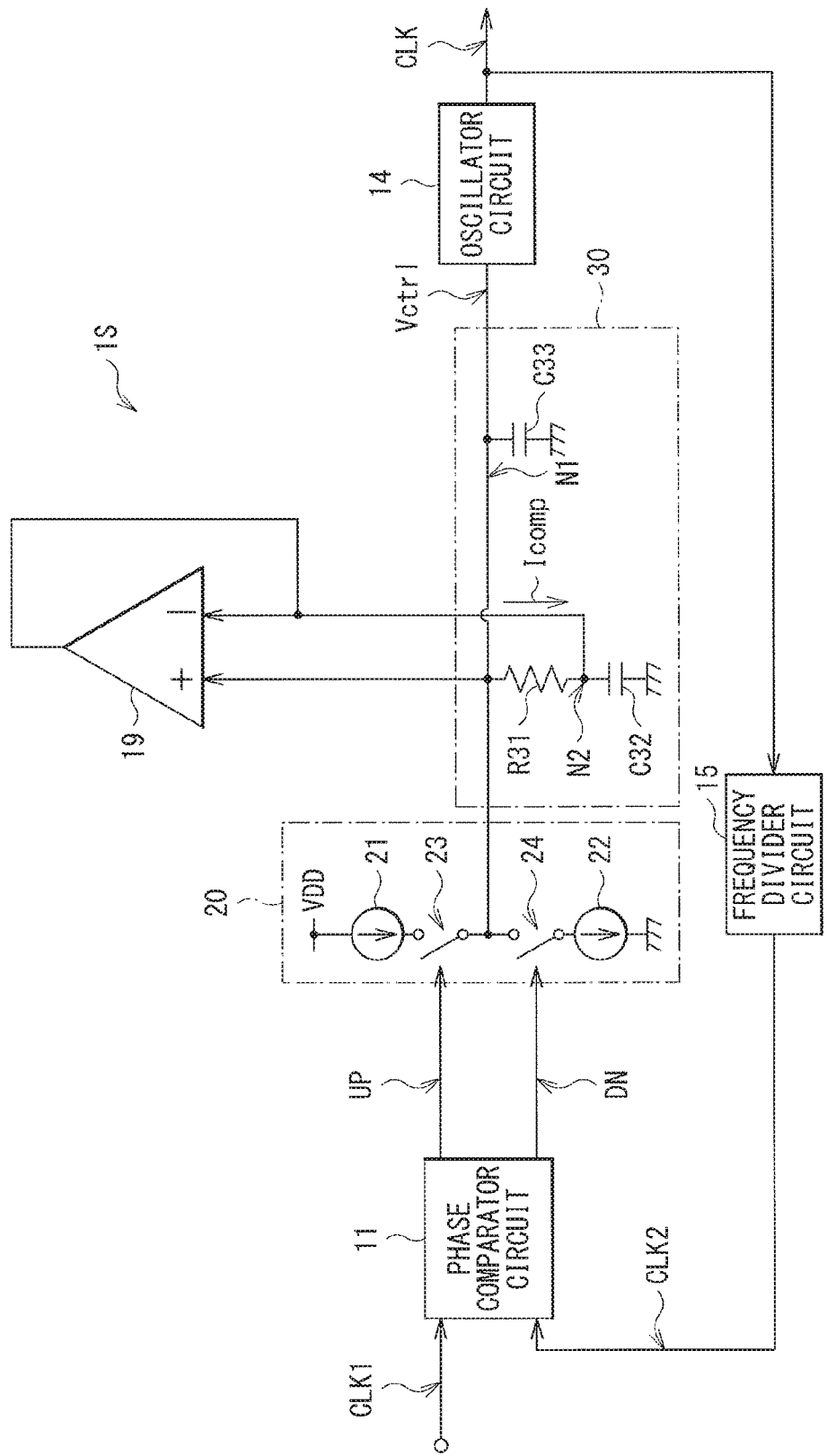
[FIG. 11]

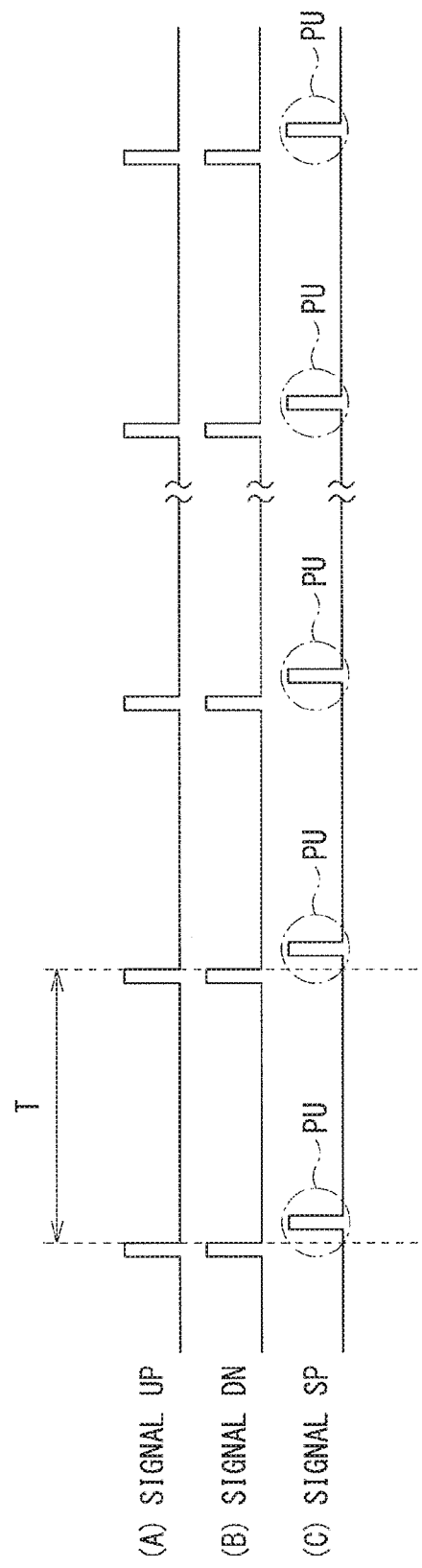

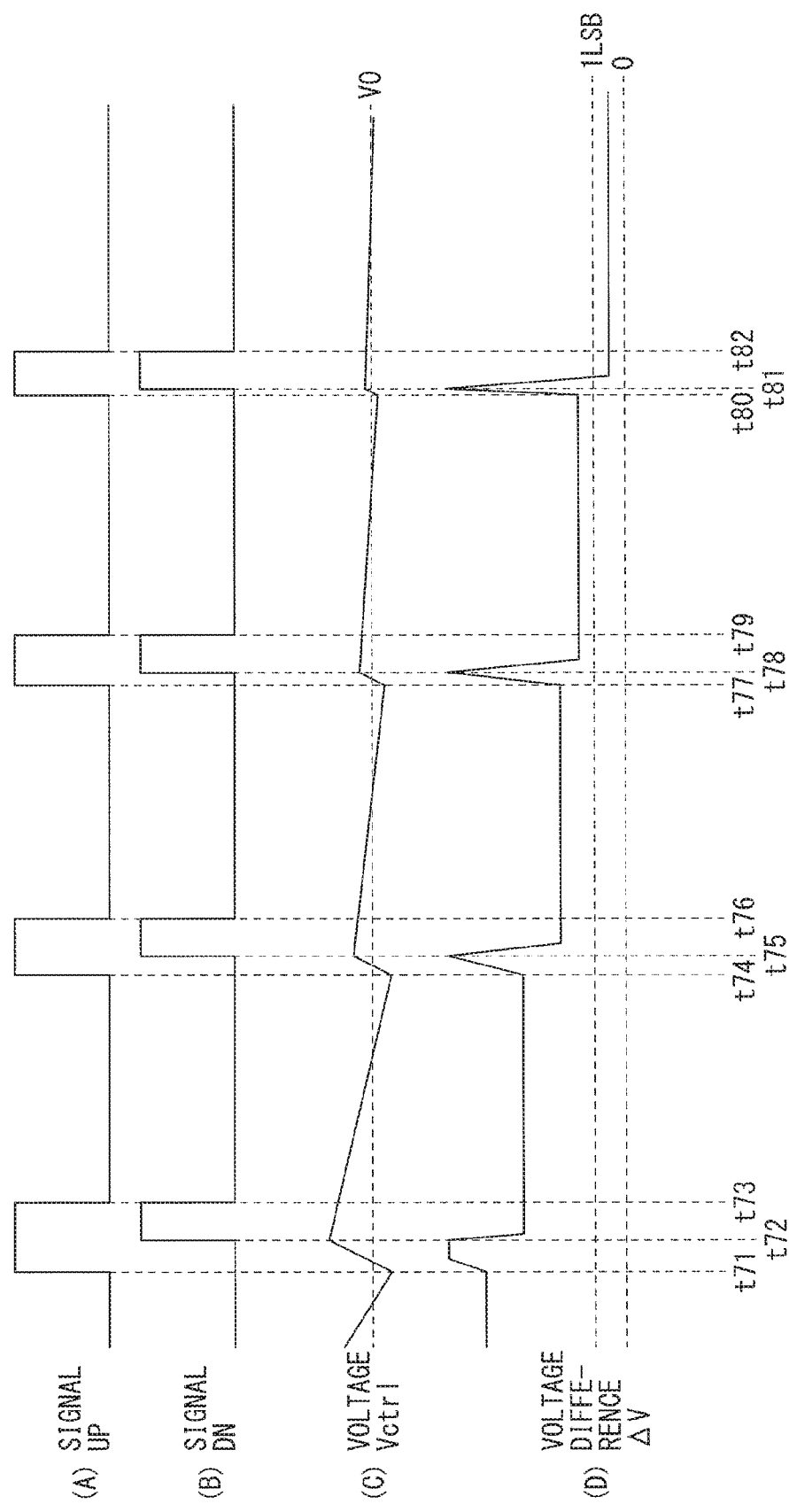

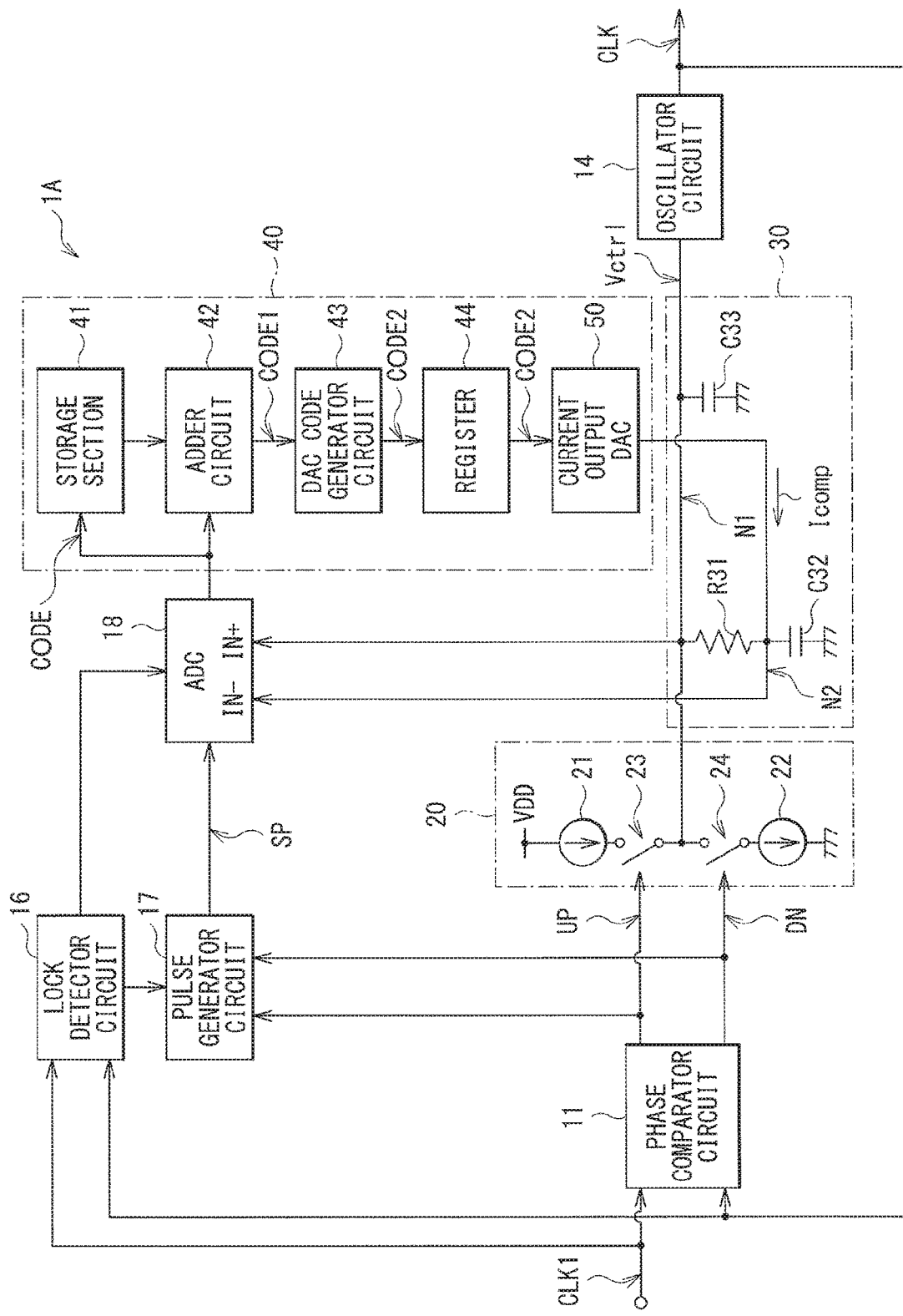
[FIG. 14]

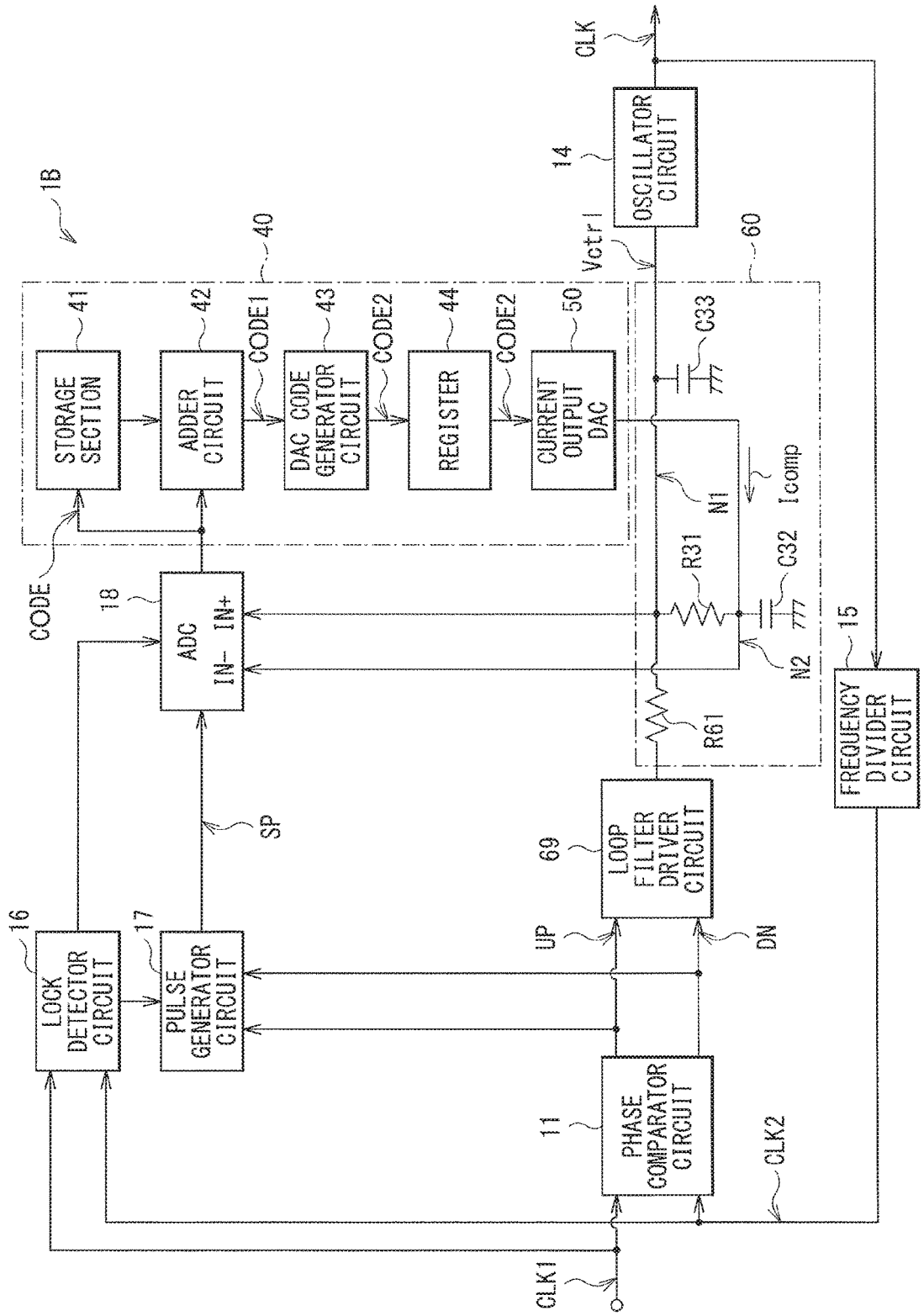
[FIG. 15]

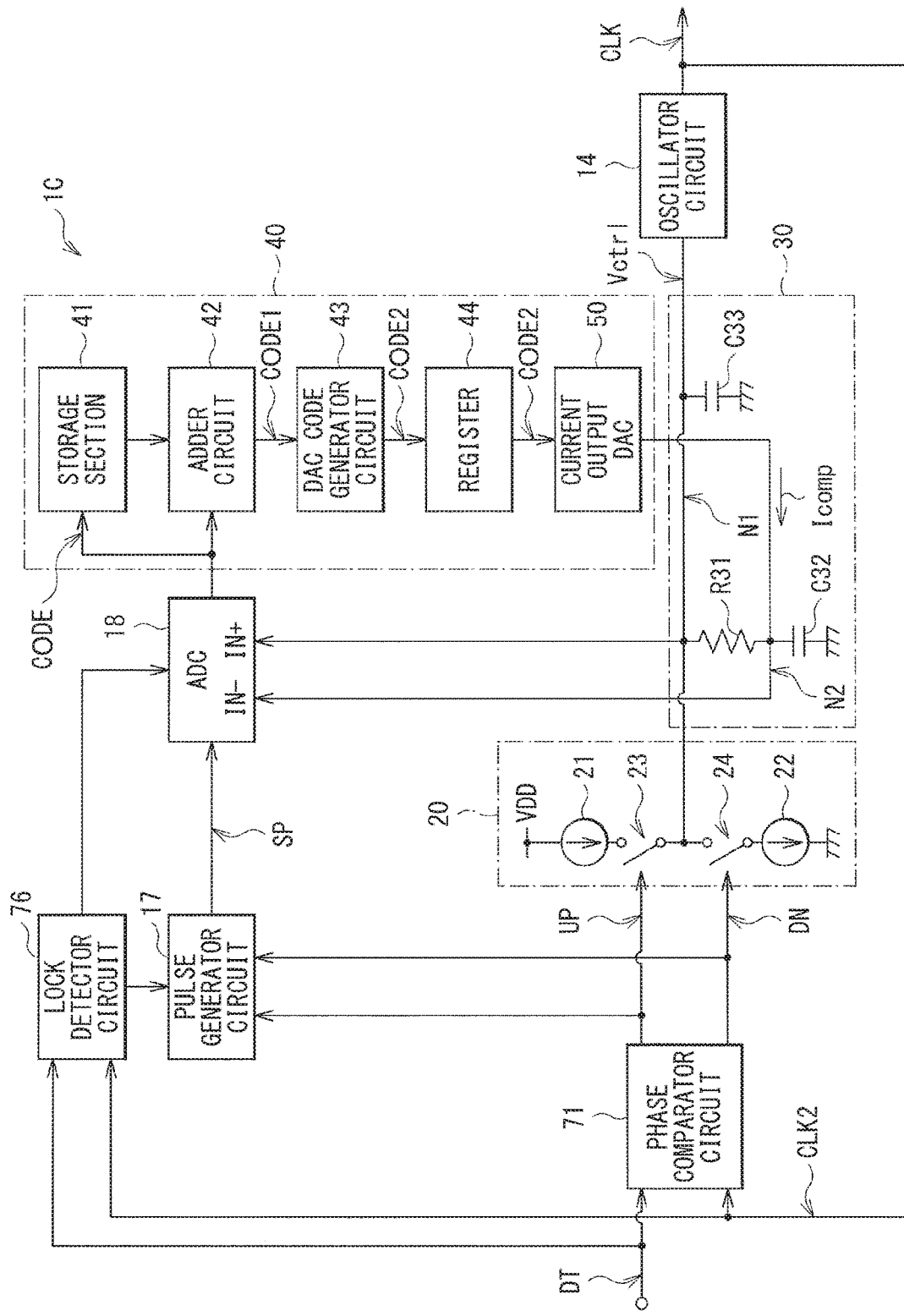
[FIG. 16]

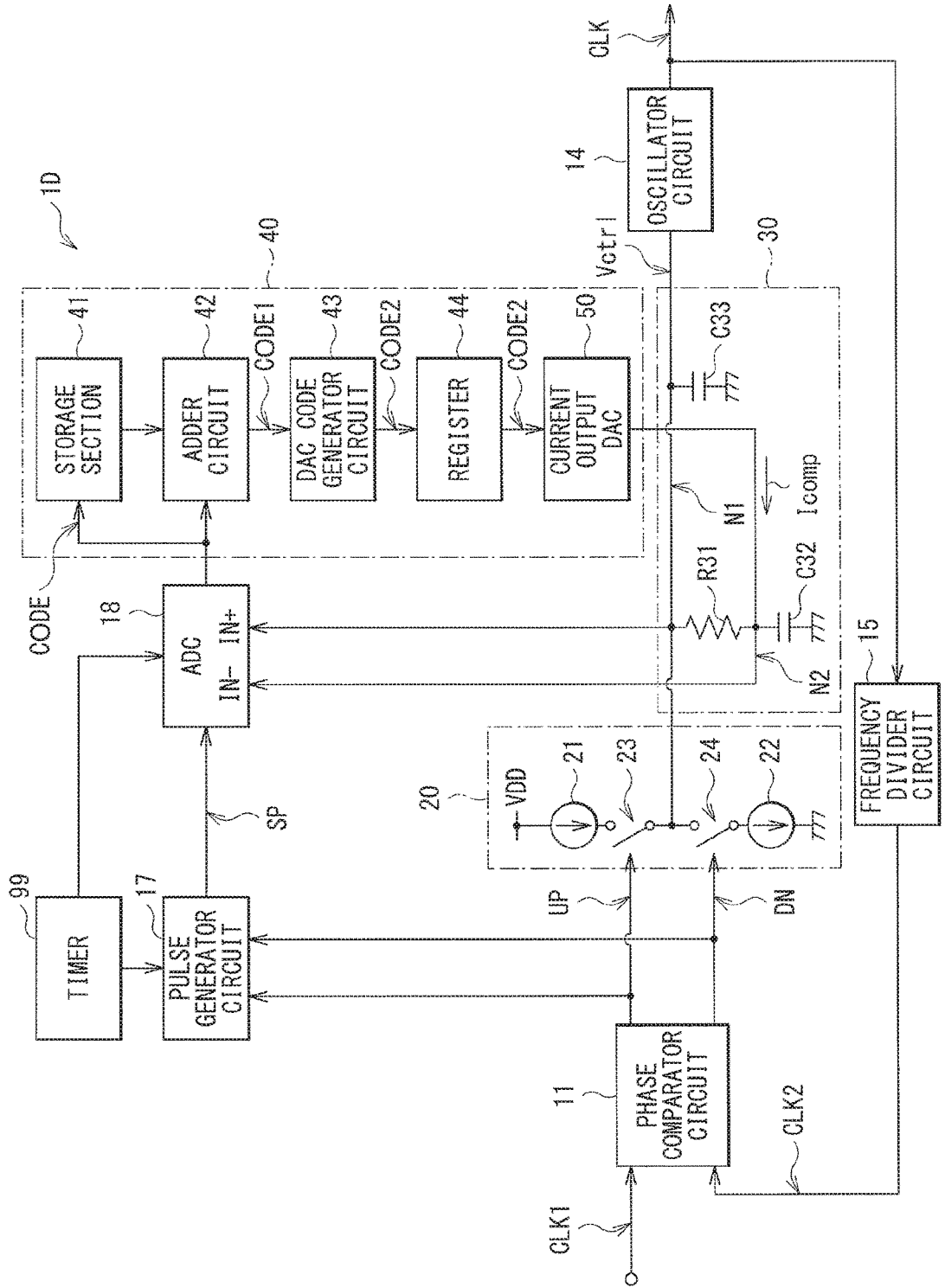
[FIG. 17]

PHASE LOCKED LOOP

CROSS REFERENCE TO RELATED APPLICATIONS

This application is a U.S. National Phase of International Patent Application No. PCT/JP2018/036704 filed on Oct. 1, 2018, which claims priority benefit of Japanese Patent Application No. JP 2017-198347 filed in the Japan Patent Office on Oct. 12, 2017. Each of the above-referenced applications is hereby incorporated herein by reference in its entirety.

TECHNICAL FIELD

The present disclosure relates to a phase locked loop that synchronizes phases.

BACKGROUND ART

A phase locked loop (PLL; Phase Locked Loop) includes, for example, a phase comparator circuit, a loop filter, an oscillator circuit, and the like. For example, PTL 1 discloses a technique attempting to compensate for a leakage current generated in a MOS (Metal Oxide Semiconductor) capacitor in a phase locked loop including a loop filter having this MOS capacitor.

CITATION LIST

Non-Patent Literature

NPTL 1: Chi-Nan CHUANG and Shen-Iuan LIU, "A 1 V Phase Locked Loop with Leakage Compensation in 0.13 μm CMOS Technology", IEICE TRANSACTIONS on Electronics, March 2006, Vol. E89-C, No. 3, p. 295-299

SUMMARY OF THE INVENTION

It is desired that jitter of a clock signal to be generated should be low in a phase locked loop, and further reduction of the jitter is expected.

It is desirable to provide a phase locked loop that makes it possible to reduce jitter of a clock signal.

A phase locked loop according to one embodiment of the present technology includes a phase comparator circuit, a loop filter, an oscillator circuit, an AD converter circuit, and a current generator circuit. The phase comparator circuit compares a phase of a first signal and a phase of a second signal based on a clock signal. The loop filter includes a resistor element and a capacitor element, and generates a control voltage on the basis of a phase comparison result of the phase comparator circuit. The resistor element has one end coupled to a first node and another end coupled to a second node. The capacitor element has one end coupled to the second node. The oscillator circuit generates the clock signal on the basis of the control voltage. The AD converter circuit converts a voltage difference between the two ends of the resistor element into a digital code. The current generator circuit generates a first current on the basis of the digital code and supplies the first current to the second node.

In the phase locked loop according to one embodiment of the present disclosure, the phase of the first signal and the phase of the second signal based on the clock signal are compared by the phase comparator circuit, and the control voltage is generated by the loop filter on the basis of the comparison result. Further, on the basis of the control voltage, the clock signal is generated by the oscillator circuit. The voltage difference between the two ends of the resistor element of the loop filter is converted into the digital code by the AD converter circuit. Further, by the current generator circuit, the first current is generated on the basis of this digital code and this first current is supplied to the second node of the loop filter.

According to the phase locked loop in one embodiment of the present disclosure, because there is provided the AD converter circuit that converts the voltage difference between the two ends of the resistor element into the digital code, it is possible to reduce jitter of the clock signal. It is to be noted that effects described herein are not necessarily limiting, and there may be any of effects set forth in the present disclosure.

BRIEF DESCRIPTION OF THE DRAWINGS

FIG. 1 is a block diagram illustrating a configuration example of a phase locked loop according to an embodiment of the present disclosure.

FIG. 2A is a timing waveform diagram illustrating an operation example of a phase comparator circuit illustrated in FIG. 1.

FIG. 2B is a timing waveform diagram illustrating another operation example of the phase comparator circuit illustrated in FIG. 1.

FIG. 2C is a timing waveform diagram illustrating another operation example of the phase comparator circuit illustrated in FIG. 1.

FIG. 3A is a circuit diagram illustrating a configuration example of a loop filter illustrated in FIG. 1.

FIG. 3B is a circuit diagram illustrating an equivalent circuit of a loop filter illustrated in FIG. 3A.

FIG. 4 is a timing waveform diagram illustrating an operation example of a pulse generator circuit illustrated in FIG. 1.

FIG. 5 is a block diagram illustrating a configuration example of a current output DA converter circuit illustrated in FIG. 1.

FIG. 6 is an explanatory diagram illustrating an operation example of a phase locked loop according to a reference example.

FIG. 7A is a timing waveform diagram illustrating an operation example of a phase locked loop illustrated in FIG. 6.

FIG. 7B is a timing waveform diagram illustrating another operation example of the phase locked loop illustrated in FIG. 6.

FIG. 8 is an explanatory diagram illustrating an operation example of the phase locked loop illustrated in FIG. 1.

FIG. 9 is a timing waveform diagram illustrating an operation example of the phase locked loop illustrated in FIG. 1.

FIG. 10 is another timing waveform diagram illustrating an operation example of the phase locked loop illustrated in FIG. 1.

FIG. 11 is a block diagram illustrating a configuration example of a phase locked loop according to a comparative example.

FIG. 12 is a timing waveform diagram illustrating an operation example of a pulse generator circuit according to a modification example.

FIG. 13 is a timing waveform diagram illustrating an operation example of a phase locked loop according to the modification example.

FIG. 14 is a block diagram illustrating a configuration example of a phase locked loop according to another modification example.

FIG. 15 is a block diagram illustrating a configuration example of a phase locked loop according to another modification example.

FIG. 16 is a block diagram illustrating a configuration example of a phase locked loop according to another modification example.

FIG. 17 is a block diagram illustrating a configuration example of a phase locked loop according to another modification example.

MODES FOR CARRYING OUT THE INVENTION

In the following, embodiments of the present disclosure are described in detail with reference to the drawings.

EMBODIMENT

[Configuration Example]

FIG. 1 illustrates a configuration example of a phase locked loop (phase locked loop 1) according to an embodiment. The phase locked loop 1 generates, on the basis of an inputted clock signal CLK1, a clock signal CLK having a frequency N-times higher than a frequency of this clock signal CLK1. This phase locked loop 1 is formed on, for example, a single semiconductor chip, and is formed using a semiconductor manufacturing technique with a minimum processing size of 90 nm or less, for example.

The phase locked loop 1 includes a phase comparator circuit 11, a charge pump 20, a loop filter 30, an oscillator circuit 14, a frequency divider circuit 15, a lock detector circuit 16, a pulse generator circuit 17, an AD (Analog to Digital) converter circuit (ADC) 18, and a compensation current generator circuit 40.

The phase comparator circuit 11 compares a phase of the clock signal CLK1 and a phase of a clock signal CLK2 (to be described later) supplied from the frequency divider circuit 15, and generates signals UP and DN based on a result of the comparison. The clock signal CLK1 is a clock signal having a cycle T. A cycle of the clock signal CLK2 is the same as the cycle T of the clock signal CLK1 in a case where an operating state of the phase locked loop 1 is a phase synchronization state. The phase comparator circuit 11 includes, for example, a so-called phase frequency comparator circuit (PFD; Phase Frequency Detector).

FIGS. 2A, 2B, and 2C each illustrate an operation example of the phase comparator circuit 11. FIG. 2A illustrates a case where the phase of the clock signal CLK1 is ahead of the phase of the clock signal CLK2. FIG. 2B illustrates a case where the phase of the clock signal CLK1 is behind the phase of the clock signal CLK2. FIG. 2C illustrates a case where the phases of the clock signal CLK1 and the clock signal CLK2 match each other.

In the case where the phase of the clock signal CLK1 is ahead of the phase of the clock signal CLK2 (FIG. 2A), in this example, a voltage of the clock signal CLK1 varies from a low level to a high level at a timing t11, and a voltage of the clock signal CLK2 varies from a low level to a high level at a later timing t12. Further, the voltage of the clock signal CLK1 varies from the high level to the low level at a timing t14, and the voltage of the clock signal CLK2 varies from the high level to the low level at a later timing t15.

The phase comparator circuit 11 causes a voltage of the signal UP to vary from a low level to a high level in accordance with a rise of the clock signal CLK1 at the timing t11, and causes a voltage of the signal DN to vary from the low level to a high level in accordance with a rise of the clock signal CLK2 at the timing t12. Further, it causes the voltage of each of the signal UP and the signal DN from the high level to the low level at a timing t13 after the timing t12. A timing difference between a rise timing (timing t11) of the signal UP and a rise timing (timing t12) of the signal DN corresponds to a phase difference between the phase of the clock signal CLK1 and the phase of the clock signal CLK2.

In the case where the phase of the clock signal CLK1 is behind the phase of the clock signal CLK2 (FIG. 2B), in this example, the voltage of the clock signal CLK2 varies from the low level to the high level at a timing t21, and the voltage of the clock signal CLK1 varies from the low level to the high level at a later timing t22. Further, it varies from the high level to the low level at a timing t24, and the voltage of the clock signal CLK1 varies from the high level to the low level at a later timing t25.

The phase comparator circuit 11 causes the voltage of the signal DN to vary from the low level to the high level in accordance with a rise of the clock signal CLK2 at the timing t21, and causes the voltage of the signal UP to vary from the low level to the high level in accordance with a rise of the clock signal CLK1 at the timing t22. Further, the phase comparator circuit 11 causes the voltage of each of the signal UP and the signal DN to vary from the high level to the low level at a timing t23 after this timing t22. A timing difference between a rise timing (timing t21) of the signal DN and a rise timing (timing t22) of the signal UP corresponds to the phase difference between the phase of the clock signal CLK1 and the phase of the clock signal CLK2.

In the case where the phases of the clock signal CLK1 and the clock signal CLK2 match each other (FIG. 2C), in this example, the voltages of the respective two clock signals CLK1 and CLK2 vary from the low level to the high level at a timing t26, and the voltages of the respective two clock signals CLK1 and CLK2 vary from the high level to the low level at a timing t28.

The phase comparator circuit 11 causes the voltage of the signal UP to vary from the low level to the high level in accordance with a rise of the clock signal CLK1 and also causes the voltage of the signal DN to vary from the low level to the high level in accordance with a rise of the clock signal CLK2 at the timing t26. Further, it causes the voltage of each of the signal UP and the signal DN to vary from the high level to the low level at a timing t27 after the timing t26.

In this manner, the phase comparator circuit 11 compares the phase of the clock signal CLK1 and the phase of the clock signal CLK2 to generate the signals UP and DN based on the phase difference between the phase of the clock signal CLK1 and the phase of the clock signal CLK2.

The charge pump 20 (FIG. 1) causes a current Icp1 to flow into the loop filter 30 or sinks a current Icp2 from the loop filter 30 on the basis of the signals UP and DN. The charge pump 20 includes two current sources 21 and 22 and two switches 23 and 24. The current source 21 generates the current Icp1 having a predetermined current value to flow into the loop filter 30. One end of the current source 21 is supplied with a power supply voltage VDD and the other end of the current source 21 is coupled to one end of the switch 23. The current source 22 generates the current Icp2 having a predetermined current value to be sunk from the loop filter 30. One end of the current source 22 is grounded to the other end of the switch 24 and the other end of the current source 22 is grounded. The current value of this current Icp2 is approximately the same as the current value of the current Icp1. The switch 23 is turned on/off in accordance with the voltage of the signal UP. One end of the switch 23 is coupled to the other end of the current source 21 and the other end of the switch 23 is coupled to one end of the switch 24 and a node N1 of the loop filter 30. In this example, the switch 23 enters an ON state in a case where the voltage of the signal UP is at the high level and enters an OFF state in a case where the voltage of the signal UP is at the low level. The switch 24 is turned on/off in accordance with the voltage of the signal DN. One end of the switch 24 is coupled to the other end of the switch 23 and the node N1 of the loop filter 30, and the other end of the switch 24 is coupled to one end of the current source 22. In this example, the switch 24 enters the ON state in a case where the voltage of the signal DN is at the high level and enters the OFF state in a case where the voltage of the signal DN is at the low level.

In the charge pump 20, in accordance with the lead or delay between the phase of the clock signal CLK1 and the phase of the clock signal CLK2, this configuration allows for the switches 23 and 24 to be selectively turned on/off in a period of a length corresponding to the phase difference. Further, in a period in which the voltage of the signal UP is at the high level, the current source 21 causes the current Icp1 to flow into the loop filter 30, and in a period in which the voltage of the signal DN is at the low level, the current source 22 sinks the current Icp2 from the loop filter 30.

The loop filter 30 generates a voltage Vctrl on the basis of a current signal supplied from the charge pump 20. The loop filter 30 includes a resistor element R31 and capacitor elements C32 and C33. One end of the resistor element R31 is coupled to the node N1 and the other end thereof is coupled to a node N2. One end of the capacitor element C32 is coupled to the node N2 and the other end thereof is grounded. One end of the capacitor element C33 is coupled to the node N1 and the other end thereof is grounded. A capacitance value of the capacitor element C32 is set to, for example, ten times or more of a capacitance value of the capacitor element C33. The capacitance value of the capacitor element C32 can be, for example, several tens pF.

In the loop filter 30, this configuration allows the capacitor elements C32 and C33 to be charged in a period in which the charge pump 20 causes the current Icp1 to flow into the loop filter 30 and allows the capacitor elements C32 and C33 to be discharged in a period in which the charge pump 20 sinks the current Icp2 from the loop filter 30. The loop filter 30 thus generates the voltage Vctrl on the basis of the current signal supplied from the charge pump 20.

In the loop filter 30, the capacitor element C32 includes an N-type MOS capacitor. The capacitor element C32 is described below in detail.

FIG. 3A illustrates a configuration example of the loop filter 30. The capacitor element C32 of the loop filter 30 includes, in this example, an N-type MOS capacitor 101. A gate of this MOS capacitor 101 is coupled to the node N2, and a drain and a source thereof are grounded. The MOS capacitor 101 uses a gate oxide film as a capacitor element. In the MOS capacitor 101, the thinner the gate oxide film is, the larger the capacitance value per unit area is allowed to be. Specifically, the capacitance value $C_{OX}$ per unit area is represented by the following expression using a thickness $t_{OX}$ of the gate oxide film, $$C_{OX} = \varepsilon_{OX}/t_{OX} \qquad (1)$$

where $\varepsilon_{OX}$ is a dielectric constant of the oxide film, which is represented by the following expression, $$\varepsilon_{OX} = \kappa \times \varepsilon_O \qquad (2)$$

where $\kappa$ is a relative dielectric constant of the oxide film, which is 3.9, for example. $\varepsilon_O$ is a dielectric constant of vacuum. As described above, because the capacitance value $C_{OX}$ and the thickness $t_{OX}$ of the gate oxide film are in a reciprocal relation to each other, the thinner the gate oxide film is, the larger the capacitance value $C_{OX}$ per unit area is. Accordingly, the use of the MOS capacitor 101 having a thin gate oxide film makes it possible, for example, to approximately double the capacitance value $C_{OX}$ per unit area. In this case, it is possible to decrease an area of the capacitor element C32 to about a half, resulting in reduction of a circuit area in the phase locked loop 1.

However, the thinner the gate oxide film is in this manner, the higher leakage current Ileak flows via this gate oxide film.

FIG. 3B illustrates an equivalent circuit of the loop filter 30. The MOS capacitor 101 can be represented using a current source 102 and a capacitor element 103 coupled in parallel to each other. The current source 102 causes the leakage current Ileak to flow from the gate to the drain and the source of the MOS capacitor 101. That is, in this example, because the voltage at the gate of the MOS capacitor 101 is higher than a voltage (ground voltage) at the drain and the source of the MOS capacitor 101, the leakage current Ileak flows from the gate toward the drain and the source of the MOS capacitor 101. A current value of this leakage current Ileak varies in accordance with the voltage difference between the gate of the MOS capacitor 101 and the drain and the source of the MOS capacitor 101. The capacitor element 103 is an ideal capacitor that represents a capacitive component of the MOS capacitor 101 and does not generate any leakage current.

As described above, in the MOS capacitor 101, the leakage current Ileak flows via the gate oxide film. Accordingly, in the phase locked loop 1, as described later, the compensation current generator circuit 40 generates a compensation current Icomp and compensates for this leakage current Ileak. In the phase locked loop 1, as described later, this suppresses an influence of this leakage current Ileak on the jitter of the clock signal CLK.

The oscillator circuit 14 (FIG. 1) is a voltage controlled oscillator circuit (VCO; Voltage Controlled Oscillator) and generates the clock signal CLK having a frequency based on the voltage Vctrl on the basis of the voltage Vctrl. A relation between the frequency of the clock signal CLK and the voltage Vctrl is represented by a gain factor $K_{VCO}$ [Hz/V]. That is, when the voltage varies by 1 [V], the frequency of the clock signal CLK varies by an amount corresponding to this gain factor $K_{VCO}$.

The frequency divider circuit 15 generates the clock signal CLK2 having a frequency that is one Nth of the frequency of the clock signal CLK on the basis of the clock signal CLK. Here, N is an integer equal to or larger than 2. It is to be noted that N is not limited thereto and may be a non-integer larger than 1.

In the phase locked loop 1, in a case where the phase of the clock signal CLK2 is behind the phase of the clock signal CLK1, this configuration increases the voltage Vctrl by charging the capacitor elements C32 and C33 of the loop filter 30. This increases the frequency of the clock signal CLK, resulting in advancement of the phase of the clock signal CLK2. Moreover, in the phase locked loop 1, in a case where the phase of the clock signal CLK2 is ahead of the phase of the clock signal CLK1, the voltage Vctrl is decreased by discharging the capacitor elements C32 and C33 of the loop filter 30. This decreases the frequency of the clock signal CLK, resulting in delay of the phase of the clock signal CLK2. This phase locked loop 1 synchronizes, by such a negative feedback action, the clock signal CLK1 and the clock signal CLK2, resulting in generation of the clock signal CLK having a frequency N-times higher than the frequency of the clock signal CLK1.

The lock detector circuit 16 detects whether or not the operating state of the phase locked loop 1 is the phase synchronization state on the basis of the clock signal CLK1 and the clock signal CLK2. Here, the "phase synchronization state" refers to a state in which the phase difference between the phase of the clock signal CLK1 and the phase of the clock signal CLK2 is kept at a small phase difference. Further, the lock detector circuit 16 supplies the pulse generator circuit 17 and the AD converter circuit (ADC) 18 with information about whether or not the operating state of the phase locked loop 1 is the phase synchronization state.

The pulse generator circuit 17 generates, when the operating state of the phase locked loop 1 is the phase synchronization state, a signal SP including a pulse PU on the basis of the signal UP and the signal DN. The signal SP instructs the AD converter circuit (ADC) 18 to perform an AD conversion operation.

FIG. 4 illustrates an operation example of the pulse generator circuit 17, in which (A) represents a waveform of the signal UP, (B) represents a waveform of the signal DN, and (C) represents a waveform of the signal SP. The pulse generator circuit 17 generates the pulse PU every time the pulse generator circuit 17 detects a fall of the signal UP and the signal DN for a plurality of times (K-times). That is, using the fact that a fall timing of the signal UP and a fall timing of the signal DN approximately match each other as illustrated in FIGS. 2A and 2B, the pulse generator circuit 17 generates the pulse PU every time the pulse generator circuit 17 detects the fall of the signals UP and DN for a plurality of times (K-times). In other words, the pulse generator circuit 17 generates the pulse PU at a cycle T1 (=T×K) that is K-times of the cycle T of the clock signal CLK1.

The AD converter circuit (ADC) 18 converts, when the operating state of the phase locked loop 1 is the phase synchronization state, a voltage difference ΔV between the two ends of the resistor element R31 in the loop filter 30 into a digital code CODE on the basis of the signal SP. The AD converter circuit 18 has a positive input terminal IN+ and a negative input terminal IN−. The positive input terminal IN+ is coupled to the node N1 of the loop filter 30, and the negative input terminal IN− is coupled to the node N2 of the loop filter 30. Further, the AD converter circuit (ADC) 18 intermittently performs the AD conversion operation on the basis of the pulse PU included in the signal SP and converts the voltage difference ΔV (analog value) between the voltage at the node N1 and the voltage at the node N2 into the digital code CODE. Further, the AD converter circuit (ADC) 18 supplies this digital code CODE to the compensation current generator circuit 40.

The compensation current generator circuit 40 generates the compensation current Icomp on the basis of the digital code CODE. The compensation current generator circuit 40 has a storage section 41, an adder circuit 42, a DAC code generator circuit 43, a register 44, and a current output DA (Digital to Analog) converter circuit (current output DAC) 50.

The storage section 41 holds the digital code CODE. The storage section 41 is allowed to hold a plurality of digital codes CODE. That is, when the operating state of the phase locked loop 1 is the phase synchronization state, the AD converter circuit (ADC) 18 intermittently performs the AD conversion operation to generate the digital code CODE. Accordingly, the storage section 41 holds the plurality of digital codes CODE sequentially supplied from the AD converter circuit (ADC) 18.

In a case where the storage section 41 holds the plurality of digital codes CODE, the adder circuit 42 adds up these digital codes CODE and outputs an addition result as a digital code CODE1. Moreover, in a case where the storage section 41 holds only one digital code CODE, the adder circuit 42 outputs this digital code CODE as it is as the digital code CODE1.

The DAC code generator circuit 43 generates a digital code CODE2 to be inputted to the current output DA converter circuit (current output DAC) 50 on the basis of the digital code CODE1.

The register 44 holds the digital code CODE2 supplied from the DAC code generator circuit 43.

The current output DA converter circuit (current output DAC) 50 generates the compensation current Icomp having the current value based on this digital code CODE2 on the basis of the digital code CODE2 supplied from the register 44, and supplies this compensation current Icomp to the loop filter 30 via the node N2.

FIG. 5 illustrates a configuration example of the current output DA converter circuit (current output DAC) 50. The current output DA converter circuit (current output DAC) 50 has a control circuit 51 and a plurality of current source circuits 52. The control circuit 51 generates a plurality of selection signals SEL on the basis of the digital code CODE2 supplied from the register 44. The plurality of current source circuits 52 outputs a current on the basis of the corresponding selection signal SEL among the plurality of selection signals SEL. Each of the plurality of current source circuits 52 has a current source 53 and a switch 54. The current source 53 generates a current having a predetermined current value, with one end being supplied with the power supply voltage VDD and the other end being coupled to one end of the switch 54. The switch 54 is turned on/off on the basis of the selection signal SEL, with one end being coupled to the other end of the current source 53 and the other end being coupled to an output terminal of the current source circuit 52. The output terminals of the plurality of current source circuits 52 are coupled to one another.

In the current output DA converter circuit (current output DAC) 50, this configuration allows the current source circuit 52 to output a current. The current source circuit 52 is selected by the selection signal SEL from among the plurality of current source circuits 52. The current output DA converter circuit (current output DAC) 50 thereby outputs the total current of the current outputted from the selected current source circuit 52 as the compensation current Icomp.

Here, the compensation current generator circuit 40 corresponds to a specific example of a "current generator circuit" in the present disclosure. The lock detector circuit 16 corresponds to a specific example of a "synchronization detector circuit" in the present disclosure. The pulse generator circuit 17 corresponds to a specific example of a "timing setting circuit" in the present disclosure. The clock signal CLK1 corresponds to a specific example of a "first signal" in the present disclosure. The clock signal CLK2 corresponds to a specific example of a "second signal" in the present disclosure. The clock signal CLK corresponds to a specific example of a "clock signal" in the present disclosure. The compensation current Icomp corresponds to a specific example of a "first current" in the present disclosure. The signal UP corresponds to a specific example of a "first control signal" in the present disclosure. The current Icp1 corresponds to a specific example of a "second current" in the present disclosure. The signal DN corresponds to a specific example of a "second control signal" in the present disclosure. The current Icp2 corresponds to a specific example of a "third current" in the present disclosure.

[Operations and Workings]

Subsequently, operations and workings of the phase locked loop 1 in the present embodiment are described.

(Overview of Overall Operation)

First, an overview of an overall operation of the phase locked loop 1 is described with reference to FIG. 1. The phase comparator circuit 11 compares the phase of the clock signal CLK1 and the phase of the clock signal CLK, and generates the signals UP and DN in accordance with the comparison result. The charge pump 20 causes the current Icp1 to flow into the loop filter 30 or sinks the current Icp2 from the loop filter 30 on the basis of the signals UP and DN. The loop filter 30 generates the voltage Vctrl on the basis of the current signal supplied from the charge pump 20. The oscillator circuit 14 generates the clock signal CLK having the frequency corresponding to the voltage Vctrl on the basis of the voltage Vctrl. The frequency divider circuit 15 generates the clock signal CLK2 having the frequency that is one Nth of the frequency of the clock signal CLK on the basis of the clock signal CLK. The lock detector circuit 16 detects whether or not the operating state of the phase locked loop 1 is the phase synchronization state on the basis of the clock signal CLK1 and the clock signal CLK2. The pulse generator circuit 17 generates, when the operating state of the phase locked loop 1 is the phase synchronization state, the signal SP including the pulse PU that instructs the AD converter circuit (ADC) 18 to perform the AD conversion operation, on the basis of the signal UP and the signal DN. The AD converter circuit (ADC) 18 converts, when the operating state of the phase locked loop 1 is the phase synchronization state, the voltage difference ΔV between the two ends of the resistor element R31 in the loop filter 30 into the digital code CODE on the basis of the signal SP. The compensation current generator circuit 40 generates the compensation current Icomp on the basis of the digital code CODE.

(Detailed Operations)

First, prior to description of an operation of the phase locked loop 1, there is described as a reference example an operation in a case where the compensation current generator circuit 40 does not generate the compensation current Icomp.

FIG. 6 illustrates an operation example of the loop filter 30 in a phase locked loop 1R according to the reference example. FIG. 7A illustrates an operation of the phase locked loop 1R in the phase synchronization state in a case where little leakage current Ileak is generated in the MOS capacitor 101, and FIG. 7B illustrates the operation of the phase locked loop 1R in the phase synchronization state in a case where the leakage current Ileak is generated in the MOS capacitor 101. In FIGS. 7A and 7B, (A) represents a waveform of the signal UP, (B) represents a waveform of the signal DN, and (C) represents a waveform of the voltage Vctrl.

In a case where little leakage current Ileak is generated in the MOS capacitor 101, as illustrated in FIG. 7A, in the phase synchronization state, the rise timing of the signal UP and the rise timing of the signal DN approximately match each other. Accordingly, in the loop filter 30, the capacitor elements C32 and C33 are scarcely charged and, in a similar manner, scarcely discharged. Owing to this, few ripples appear in the voltage Vctrl, and the voltage value of the voltage Vctrl is kept thereby. The oscillator circuit 14 generates the clock signal CLK having the frequency based on this voltage Vctrl. In this example, because the operating state of the phase locked loop 1R is the phase synchronization state, the frequency of the clock signal CLK is a frequency N-times higher than the frequency of the clock signal CLK1. That is, the voltage value of the voltage Vctrl at this point is a voltage value V0 corresponding to the frequency N-times higher than the frequency of the clock signal CLK1.

In contrast, in a case where the leakage current Ileak is generated in the MOS capacitor 101, as illustrated in FIG. 6, the leakage current Ileak flows through the capacitor element C33, the resistor element R31, and the capacitor element C32 in this order. This leakage current Ileak causes the voltage difference ΔV between the two ends of the resistor element R31. Further, this leakage current Ileak allows the capacitor elements C32 and C33 to be discharged, and the voltage Vctrl gradually decreases thereby. Meanwhile, because the operating state of the phase locked loop 1R remains as the phase synchronization state, in the phase locked loop 1R, as illustrated in FIG. 7B, the rise timing of the signal UP and the rise timing of the signal DN are offset from each other to make an average value of the voltage of the voltage Vctrl to be the voltage value V0. That is, the signal UP rises at a timing t31 and the signal DN rises at a timing t32. Thereby, in the period from the timing t31 to the timing t32, the current Icp1 is supplied from the charge pump 20, whereby the capacitor elements C32 and C33 are charged and the voltage Vctrl increases. In the period from the timing t32 to a timing t34, the leakage current Ileak causes the capacitor elements C32 and C33 to be discharged, and the voltage Vctrl decreases thereby. The average value of the voltage value of the voltage Vctrl remains the voltage value V0.

As illustrated in FIG. 7B, in a case where the leakage current Ileak is generated in the MOS capacitor 101, a ripple occurs in the voltage Vctrl. Because the oscillator circuit 14 causes the frequency of the clock signal CLK to vary at a rate corresponding to the gain factor $K_{VCO}$ on the basis of this voltage Vctrl, the clock signal CLK is periodically modulated on the basis of the ripple in the voltage Vctrl. As a result, there is a possibility that DJ (Deterministic Jitter) occurs and the jitter in the clock signal CLK increases in the phase locked loop 1R.

Therefore, in the phase locked loop 1 according to the present embodiment, the compensation current generator circuit 40 generates the compensation current Icomp and compensates for this leakage current Ileak. The operation of the phase locked loop 1 is described in detail below.

FIG. 8 illustrates an operation example of the loop filter 30 in the phase locked loop 1. FIG. 9 illustrates the operation of the phase locked loop 1 in the phase synchronization state in a case where there is the leakage current Ileak in the MOS capacitor 101, in which (A) represents a waveform of the signal UP, (B) represents a waveform of the signal DN, and (C) represents a waveform of the voltage Vctrl. In FIG. 9, the waveform of the signal UP and the waveform of the voltage Vctrl illustrated in FIG. 7B are indicated by broken lines.

In the phase locked loop 1, when the operating state of the phase locked loop 1 is the phase synchronization state, the AD converter circuit (ADC) 18 converts the voltage difference ΔV between the two ends of the resistor element R31 in the loop filter 30 into the digital code CODE on the basis of the signal SP. Further, the compensation current generator circuit 40 generates the compensation current Icomp on the basis of the digital code CODE. At this time, the phase locked loop 1 controls the current value of the compensation current Icomp to reduce the voltage difference ΔV between the two ends of the resistor element R31. In other words, it controls the current value of the compensation current Icomp to bring the current value of the compensation current Icomp closer to the current value of the leakage current Ileak. This makes it possible to suppress a decrease of the voltage Vctrl. This causes the timing difference between the rise timing of the signal UP and the rise timing of the signal DN to be smaller compared with that in the case of FIG. 7B. As a result, in the phase locked loop 1, it is possible to make the ripple generated in the voltage Vctrl smaller.

In this manner, in the phase locked loop 1, because the current value of the compensation current Icomp is controlled to reduce the voltage difference ΔV between the two ends of the resistor element R31, it is possible to make the ripple generated in the voltage Vctrl smaller. As a result, in the phase locked loop 1, it is possible to suppress an amount of the DJ (Deterministic Jitter) generated, and thereby to make the jitter in the clock signal CLK smaller.

Moreover, in the phase locked loop 1, when the operating state of the phase locked loop 1 is the phase synchronization state, as illustrated in FIG. 4, the pulse generator circuit 17 generates the pulse PU every time the pulse generator circuit 17 detects the fall of the signal UP and the signal DN for a plurality of times. The AD converter circuit (ADC) 18 intermittently performs the AD conversion operation on the basis of this pulse PU, and converts the voltage difference ΔV between the two ends of the resistor element R31 into the digital code CODE. Further, the compensation current generator circuit 40 generates the compensation current Icomp on the basis of the plurality of digital codes CODE sequentially supplied from the AD converter circuit (ADC) 18.

Specifically, in the compensation current generator circuit 40, the storage section 41 holds the plurality of digital codes CODE sequentially supplied from the AD converter circuit (ADC) 18, the adder circuit 42 adds up these digital codes CODE and outputs the addition result as the digital code CODE1, the DAC code generator circuit 43 generates the digital code CODE2 on the basis of the digital code CODE1, the register 44 holds the digital code CODE2, and the current output DA converter circuit (current output DAC) 50 generates the compensation current Icomp on the basis of the digital code CODE2 supplied from the register 44. In the phase locked loop 1, as described below, this makes it possible to suppress the voltage difference ΔV between the two ends of the resistor element R31 to be equal to or smaller than a voltage corresponding to 1LSB (Least Significant Bit) in the AD converter circuit (ADC) 18.

FIG. 10 illustrates an operation example of the phase locked loop 1 in a case where the operating state of the phase locked loop 1 is the phase synchronization state, in which (A) represents a waveform of the signal UP, (B) represents a waveform of the signal DN, (C) represents a waveform of the voltage Vctrl, and (D) represents a waveform of the voltage difference ΔV.

Although not illustrated, the pulse generator circuit 17 generates a plurality of pulses PU in a period from a timing t51 to a timing t60. Further, the AD converter circuit (ADC) 18 intermittently performs the AD conversion operation on the basis of these pulses PU and sequentially generates the digital codes CODE. Further, the compensation current generator circuit 40 generates the compensation current Icomp on the basis of the plurality of digital codes CODE sequentially supplied from the AD converter circuit (ADC) 18. In the phase locked loop 1, as illustrated in FIG. 10, this makes it possible to gradually bring the rise timing of the signal UP and the rise timing of the signal DN closer to each other and thereby to gradually make the ripple in the voltage Vctrl smaller. Moreover, it is possible to gradually bring the voltage difference ΔV between the two ends of the resistor element R31 closer to 0 V and thereby to cause this voltage difference ΔV to be equal to or smaller than a voltage corresponding to the 1LSB in the AD converter circuit (ADC) 18.

(Comparative Example)

Next, the workings of the present embodiment are described by contrast with a comparative example. A phase locked loop 1S according to the present comparative example is different from the phase locked loop 1 according to the present embodiment in a method of generating the compensation current Icomp. It is to be noted that components substantially identical to those in the phase locked loop 1 according to the present embodiment are denoted with the same reference numerals, and descriptions thereof are omitted where appropriate.

FIG. 11 illustrates a configuration example of the phase locked loop 1S. The phase locked loop 1S includes the phase comparator circuit 11, the charge pump 20, the loop filter 30, the oscillator circuit 14, the frequency divider circuit 15, and an operation amplifier circuit (Operational Amplifier) 19. A positive input terminal of the operation amplifier circuit 19 is coupled to the node N1 of the loop filter 30, a negative input terminal thereof is coupled to the node N2 of the loop filter 30, and an output terminal thereof is coupled to the node N2 of the loop filter.

In this manner, because the negative input terminal and the output terminal of the operation amplifier circuit 19 are coupled to each other, the phase locked loop 1S has approximately the same voltages at the nodes N1 and N2 as a result of so-called virtual short. Further, the compensation current Icomp flows from the output terminal of the operation amplifier circuit 19 to the loop filter 30 via the node N2.

An input offset voltage, however, generally occurs in the operation amplifier circuit 19 due to mismatch variation of a differential pair of transistors or the like, for example. Accordingly, there is a possibility that, in the phase locked loop 1S according to the comparative example, this input offset voltage causes an offset to the voltage at the node N1 and the voltage at the node N2, and consequently, the leakage current Ileak in the capacitor element C32 cannot be sufficiently compensated for. In such a case, there is a possibility that the jitter in the clock signal CLK increases.

In contrast, the phase locked loop 1 according to the present embodiment generates the compensation current Icomp without using the operation amplifier circuit 19 but with the use of the AD converter circuit (ADC) 18 and the compensation current generator circuit 40. As described above, this makes it possible in the phase locked loop 1 to suppress the voltage difference ΔV to be equal to or smaller than the voltage corresponding to the 1 LSB in the AD converter circuit (ADC) 18 and thereby to sufficiently compensate for the leakage current Ileak. As a result, it is possible in the phase locked loop 1 to suppress the jitter in the clock signal CLK.

Moreover, in the phase locked loop 1S according to the comparative example, for example, because the voltage Vctrl is variable in a wide voltage range, the operation amplifier circuit 19 is required to operate in such a wide voltage range. Accordingly, there is a possibility that the sufficient compensation current Icomp cannot be generated when the voltage Vctrl is high, for example. In such a case, there is a possibility that the jitter in the clock signal CLK increases.

In contrast, in the phase locked loop 1 according to the present embodiment, because the compensation current Icomp is generated using the current output DA converter circuit (current output DAC) 50, it is possible to generate the sufficient compensation current Icomp even in a case where the voltage Vctrl is high. As a result, it is possible in the phase locked loop 1 to suppress the jitter in the clock signal CLK.

Moreover, in the phase locked loop 1S according to the comparative example, because the operation amplifier circuit 19 operates in a temporally continuous manner, the operation amplifier circuit 19 becomes a noise source, causing a noise (random noise) in the voltage Vctrl. Accordingly, in the oscillator circuit 14, the clock signal CLK is randomly modulated on the basis of the random noise in this voltage Vctrl. As a result, there is a possibility that RJ (Random Jitter) occurs and the jitter in the clock signal CLK increases in the phase locked loop 1S.

In contrast, in the phase locked loop 1 according to the present embodiment, the digital code CODE is generated by the AD converter circuit (ADC) 18 intermittently performing the AD conversion operation. Further, the compensation current generator circuit 40 generates the compensation current Icomp on the basis of this digital code CODE. In this manner, in the phase locked loop 1, because the AD converter circuit (ADC) 18 and the compensation current generator circuit 40 operate in a temporally discrete manner, a possibility that these circuits become the noise source is allowed to be reduced. It is therefore possible to suppress the jitter in the clock signal CLK.

[Effects]

As described above, in the present embodiment, because the AD converter circuit converts the voltage difference between the two ends of the resistor element in the loop filter into the digital code, and the compensation current generator circuit generates the compensation current on the basis of this digital code, it is possible to suppress the jitter in the clock signal.

In the present embodiment, because the AD converter circuit converts the voltage difference between the two ends of the resistor element in the loop filter into the digital code by intermittently performing the AD conversion operation and the compensation current generator circuit generates the compensation current on the basis of the plurality of digital codes sequentially supplied from the AD converter circuit, it is possible to suppress the jitter in the clock signal.

[Modification Example 1-1]

Although the pulse generator circuit 17 generates the pulse PU every time it detects the fall of the signal UP and the signal DN for a plurality of times in the embodiment described above, it is not limiting. Alternatively, as illustrated in FIG. 12, for example, the pulse generator circuit 17 may generate the pulse PU every time it detects the fall of the signal UP and the signal DN once. In this case, it is desirable to use a so-called flash type AD converter circuit as the AD converter circuit (ADC) 18, for example. As illustrated in FIG. 13, this makes it possible for the phase locked loop 1 to gradually bring the voltage difference ΔV between the two ends of the resistor element R31 closer to 0 V and thereby to make it equal to or smaller than the voltage corresponding to the 1 LSB in the AD converter circuit (ADC) 18 faster.

[Modification Example 1-2]

Although the frequency divider circuit 15 is provided in the above-described embodiment, it is not limiting. Alternatively, the frequency divider circuit 15 may not be provided as in a phase locked loop 1A illustrated in FIG. 14, for example. In this case, the phase comparator circuit 11 compares the phase of the clock signal CLK1 and the phase of the clock signal CLK supplied from the oscillator circuit 14 and generates the signals UP and DN in accordance with the comparison result. The frequency of the clock signal CLK is approximately the same as the frequency of the clock signal CLK1.

[Modification Example 1-3]

Although the charge pump 20 is provided in the above-described embodiment, it is not limiting. Alternatively, the charge pump 20 may not be provided as in a phase locked loop 1B illustrated in FIG. 15, for example. This phase locked loop 1B includes a loop filter driver circuit 69 and a loop filter 60. The loop filter driver circuit 69 drives the loop filter 60 on the basis of the signals UP and DN. Specifically, the loop filter driver circuit 69, for example, outputs a high-level voltage VH in a case where the signal UP is at the high level and the signal DN is at the low level, outputs a low-level voltage VL in a case where the signal DN is at the high level and the signal UP is at the low level, and turns output impedance of the loop filter driver circuit 69 into high impedance in other cases. The loop filter 60 has a resistor element R61. One end of the resistor element R61 is coupled to the output terminal of the loop filter driver circuit and the other end is coupled to the node N1.

[Modification Example 1-4]

Although the clock signal CLK1 is inputted to the phase locked loop 1 in the above-described embodiment, it is not limiting. Alternatively, a data signal DT may be inputted as in a phase locked loop 1C illustrated in FIG. 16, for example. This phase locked loop 1C is a clock recovery circuit (CRC: Clock Recovery Circuit) that recovers, on the basis of the inputted data signal DT, the clock signal CLK synchronous with this data signal DT. The phase locked loop 1C includes a phase comparator circuit 71, the charge pump 20, the loop filter 30, the oscillator circuit 14, a lock detector circuit 76, the pulse generator circuit 17, the AD converter circuit (ADC) 18, and the compensation current generator circuit 40. The phase comparator circuit 71 compares the phase of the data signal DT and the phase of the clock signal CLK supplied from the oscillator circuit 14, and generates the signals UP and DN in accordance with the comparison result. A bit rate of the data signal DT is approximately the same as the frequency of the clock signal CLK. The lock detector circuit 76 detects whether or not the operating state of the phase locked loop 1C is the phase synchronization state on the basis of the data signal DT and the clock signal CLK.

[Other Modification Examples]

Moreover, two or more of these modification examples may be combined.

Although the present technology has been described above with reference to the embodiment and the modification examples, the present technology is not limited to the above-described embodiment and the like and may be modified in a variety of ways.

For example, although the lock detector circuit 16 is provided in the above-described embodiment, it is not limiting. Alternatively, the lock detector circuit 16 may not be provided as in a phase locked loop 1D illustrated in FIG. 17, for example. This phase locked loop 1D includes a timer 99. The timer 99 determines that the operating state of the phase locked loop 1D has become the phase synchronization state when a predetermined time has elapsed from a power-on timing of the phase locked loop 1D. That is, when the power is turned on, the phase locked loop 1D first operates to make the frequency of the clock signal CLK equal to N-times of the frequency of the clock signal CLK1, and thereafter operates to synchronize the phase of the clock signal CLK1 and the phase of the clock signal CLK2. Hence, the timer 99 is set in advance with a time required from the time at which the power is turned on to a time at which phase synchronization is established. Further, the timer 99 determines that the operating state of the phase locked loop 1D has become the phase synchronization state when this time has elapsed from the power-on timing. Thereafter, the pulse generator circuit 17 starts generating the pulse PU and the AD converter circuit (ADC) 18 starts the AD conversion operation.

It is to be noted that the effects described herein are mere examples and not limiting, and other effects may be provided.

It is to be noted that the present technology may have the following configurations.

(1)
A phase locked loop, including:
a phase comparator circuit that compares a phase of a first signal and a phase of a second signal based on a clock signal;
a loop filter that includes a resistor element and a capacitor element, and generates a control voltage on the basis of a phase comparison result of the phase comparator circuit, the resistor element having one end coupled to a first node and another end coupled to a second node, the capacitor element having one end coupled to the second node;
an oscillator circuit that generates the clock signal on the basis of the control voltage;
an AD converter circuit that converts a voltage difference between the two ends of the resistor element into a digital code; and
a current generator circuit that generates a first current on the basis of the digital code and supplies the first current to the second node.

(2)
The phase locked loop according to (1) described above, in which
the AD converter circuit converts the voltage difference into a first digital code at a first timing and converts the voltage difference into a second digital code at a second timing, and
the current generator circuit generates the first current on the basis of the first digital code and the second digital code.

(3)
The phase locked loop according to (2) described above, in which the current generator circuit adds up the first digital code and the second digital code, and generates the first current on the basis of an addition result.

(4)
The phase locked loop according to any one of (1) to (3) described above, in which the AD converter circuit converts the voltage difference into the digital code in a period in which an operating state of the phase locked loop is a phase synchronization state.

(5)
The phase locked loop according to (4) described above, further including
a synchronization detector circuit that detects whether or not the operating state of the phase locked loop is the phase synchronization state, in which the AD converter circuit converts the voltage difference into the digital code on the basis of a detection result of the synchronization detector circuit.

(6)
The phase locked loop according to any one of (1) to (5) described above, in which the AD converter circuit intermittently converts the voltage difference into the digital code.

(7)
The phase locked loop according to (6) described above, in which
the first signal is a clock signal, and
the AD converter circuit converts the voltage difference into the digital code at a cycle of an integer multiple of a cycle of the first signal.

(8)
The phase locked loop according to any one of (1) to (7), further including
a charge pump coupled to the first node, in which
the phase comparator circuit includes a phase frequency comparator circuit that generates a first control signal and a second control signal on the basis of the phase comparison result, and
the charge pump causes a second current to flow into the loop filter to charge the capacitor element on the basis of the first control signal and causes a third current to flow into the loop filter to discharge the capacitor element on the basis of the second control signal.

(9)
The phase locked loop according to (8) described above, further including a timing setting circuit that sets an operation timing of the AD converter circuit on the basis of the first control signal and the second control signal.

(10)
The phase locked loop according to any one of (1) to (9), further including a frequency divider circuit that divides the clock signal to generate the second signal.

(11)
The phase locked loop according to any one of (1) to (10) described above, in which the capacitor element includes a MOS capacitor.

(12)
The phase locked loop according to any one of (1) to (11) described above, in which the first current includes a current that suppresses the voltage difference between the two ends of the resistor element.

This application claims the priority on the basis of Japanese Patent Application No. 2017-198347 filed with the Japanese Patent Office on Oct. 12, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A phase locked loop, comprising:
a phase comparator circuit configured to compare a phase of a first signal and a phase of a second signal based on a clock signal;
a loop filter configured to:
include a resistor element and a capacitor element, and
generate a control voltage based on a phase comparison result of the phase comparator circuit, the resistor element having a first end coupled to a first node and a second end coupled to a second node, the capacitor element having one end coupled to the second node;

an oscillator circuit configured to generate the clock signal based on the control voltage;

an analog-digital (AD) converter circuit configured to convert a voltage difference between the first end and the second end of the resistor element into a digital code; and a current generator circuit configured to:
generate a first current based on the digital code, and supply the first current to the second node.

2. The phase locked loop according to claim 1, wherein the AD converter circuit is further configured to convert the voltage difference into a first digital code at a first timing and converts the voltage difference into a second digital code at a second timing, and the current generator circuit is further configured to generate the first current based on the first digital code and the second digital code.

3. The phase locked loop according to claim 2, wherein the current generator circuit is further configured to:
add the first digital code and the second digital code, and
generate the first current based on an addition result.

4. The phase locked loop according to claim 1, wherein the AD converter circuit is further configured to convert the voltage difference into the digital code in a period in which an operating state of the phase locked loop is a phase synchronization state.

5. The phase locked loop according to claim 4, further comprising
a synchronization detector circuit configured to detect whether or not the operating state of the phase locked loop is the phase synchronization state, wherein
the AD converter circuit is further configured to convert the voltage difference into the digital code based on a detection result of the synchronization detector circuit.

6. The phase locked loop according to claim 1, wherein the AD converter circuit is further configured to intermittently convert the voltage difference into the digital code.

7. The phase locked loop according to claim 6, wherein the first signal is a clock signal, and
the AD converter circuit is further configured to convert the voltage difference into the digital code at a cycle of an integer multiple of a cycle of the first signal.

8. The phase locked loop according to claim 1, further comprising
a charge pump coupled to the first node, wherein
the phase comparator circuit comprises a phase frequency comparator circuit configured to generate a first control signal and a second control signal based on the phase comparison result, and
the charge pump is configured to:
cause a second current to flow into the loop filter to charge the capacitor element based on the first control signal, and
cause a third current to flow into the loop filter to discharge the capacitor element based on the second control signal.

9. The phase locked loop according to claim 8, further comprising a timing setting circuit configured to set an operation timing of the AD converter circuit based on the first control signal and the second control signal.

10. The phase locked loop according to claim 1, further comprising a frequency divider circuit configured to divide the clock signal to generate the second signal.

11. The phase locked loop according to claim 1, wherein the capacitor element includes a MOS capacitor.

12. The phase locked loop according to claim 1, wherein the first current comprises a current that suppresses the voltage difference between the first end and the second end of the resistor element.

* * * * *